US012189291B2

(12) United States Patent
Nawrocki et al.

(10) Patent No.: US 12,189,291 B2
(45) Date of Patent: Jan. 7, 2025

(54) EPOXY FORMULATIONS AND PROCESSES FOR FABRICATION OF RELIEF PATTERNS ON LOW SURFACE ENERGY SUBSTRATES

(75) Inventors: Daniel J. Nawrocki, Chicopee, MA (US); Jeremy V. Golden, Burlington, MA (US); William D. Weber, East Providence, RI (US)

(73) Assignee: KAYAKU ADVANCED MATERIALS, INC., Westborough, MA (US)

( * ) Notice: Subject to any disclaimer, the term of this patent is extended or adjusted under 35 U.S.C. 154(b) by 0 days.

(21) Appl. No.: 14/241,745

(22) PCT Filed: Sep. 5, 2012

(86) PCT No.: PCT/US2012/053738
§ 371 (c)(1),
(2), (4) Date: Jun. 11, 2014

(87) PCT Pub. No.: WO2013/036502
PCT Pub. Date: Mar. 14, 2013

(65) Prior Publication Data
US 2014/0302430 A1 Oct. 9, 2014

Related U.S. Application Data

(60) Provisional application No. 61/573,491, filed on Sep. 7, 2011.

(51) Int. Cl.
*G03F 7/038* (2006.01)
*C08G 59/32* (2006.01)
(Continued)

(52) U.S. Cl.
CPC ......... *G03F 7/038* (2013.01); *C08G 59/3218* (2013.01); *C08L 63/00* (2013.01); *G03F 7/0046* (2013.01); *G03F 7/11* (2013.01)

(58) Field of Classification Search
CPC .......... C08L 63/00; G03F 7/0046; G03F 7/11; G03F 7/038; G03F 7/0045; G03F 7/027;
(Continued)

(56) References Cited

U.S. PATENT DOCUMENTS 4,189,323 A 2/1980 Buhr
4,246,298 A * 1/1981 Guarnery et al. ............ 427/493
(Continued)

FOREIGN PATENT DOCUMENTS

CN 1934498 A 3/2007
EP 0164248 A2 12/1985
(Continued)

OTHER PUBLICATIONS

Bekhli et al., "Fluorine-Containing Compounds Improvising Adhesion of Epoxy Oligomers to Materials with Low Surface Energy" Polymer Science; vol. 49; No. 3; (2007); pp. 264-268.
(Continued)

*Primary Examiner* — Martin J Angebranndt
(74) *Attorney, Agent, or Firm* — CANTOR COLBURN LLP

(57) ABSTRACT

The present invention is directed to a permanent epoxy photoresist composition useful for making negative-tone, permanent photoresist relief patterns on low surface energy polymer substrates, comprising: (A) one or more epoxy resins according to Formulas I-VI, (B) one or more cationic photoinitiators; (C) one or more film casting solvents; and (D) one or more fluorinated compounds. The present invention is also directed to methods of forming a permanent photoresist relief pattern on a low surface energy polymer substrate using the disclosed composition.

12 Claims, 3 Drawing Sheets

(51) Int. Cl.
*C08L 63/00* (2006.01)
*G03F 7/004* (2006.01)
*G03F 7/11* (2006.01)

(58) Field of Classification Search
CPC . G03F 7/029; G03F 7/031; G03F 7/40; G03F 7/039; G03F 7/057; C08G 59/3218
See application file for complete search history.

(56) References Cited

U.S. PATENT DOCUMENTS

| | | | |
|---|---|---|---|
| 4,250,203 A * | 2/1981 | Schlesinger et al. | 427/518 |
| 4,366,228 A | 12/1982 | Specht et al. | |
| 4,491,628 A | 1/1985 | Ito et al. | |
| 4,548,891 A | 10/1985 | Riediker et al. | |
| 4,565,859 A | 1/1986 | Murai et al. | |
| 4,841,017 A | 6/1989 | Murai et al. | |
| 4,874,798 A * | 10/1989 | Koleske et al. | 522/31 |
| 4,961,976 A * | 10/1990 | Hashimoto et al. | 428/34.6 |
| 4,980,268 A | 12/1990 | Bartmann et al. | |
| 5,019,482 A | 5/1991 | Ai et al. | |
| 5,049,628 A | 9/1991 | Nawata et al. | |
| 5,215,863 A | 6/1993 | Nawata et al. | |
| 5,300,402 A * | 4/1994 | Card et al. | 430/280.1 |
| 5,344,742 A | 9/1994 | Sinta et al. | |
| 5,362,607 A | 11/1994 | Crivello et al. | |
| 5,395,862 A | 3/1995 | Neckers et al. | |
| 5,403,437 A | 4/1995 | Beratan et al. | |
| 5,451,343 A | 9/1995 | Neckers et al. | |
| 5,492,793 A | 2/1996 | Breyta et al. | |
| 5,494,698 A | 2/1996 | White et al. | |
| 5,538,821 A | 7/1996 | Kakinuma et al. | |
| 5,545,702 A | 8/1996 | Oishi et al. | |
| 5,656,336 A * | 8/1997 | Kamen et al. | 427/511 |
| 5,837,420 A | 11/1998 | Aoai et al. | |
| 6,042,997 A | 3/2000 | Barclay et al. | |
| 6,066,889 A * | 5/2000 | Jones et al. | 257/698 |
| 6,110,640 A | 8/2000 | Kawamura et al. | |
| 6,284,185 B1 | 9/2001 | Tokuda et al. | |
| 6,294,239 B1 | 9/2001 | Tokuda et al. | |
| 6,524,708 B2 | 2/2003 | Puligadda et al. | |
| 6,730,452 B2 | 5/2004 | Brock et al. | |
| 6,824,948 B1 | 11/2004 | Aoai et al. | |
| 7,055,938 B1 * | 6/2006 | Ohkuma et al. | 347/65 |
| 7,282,324 B2 | 10/2007 | Weber et al. | |
| 7,358,027 B2 | 4/2008 | Ito et al. | |
| 7,359,108 B2 | 4/2008 | Hayes et al. | |
| 7,479,364 B2 | 1/2009 | Ito | |
| 7,800,816 B2 | 9/2010 | Hayes et al. | |
| 7,813,030 B2 | 9/2010 | Lo et al. | |
| 8,232,235 B2 | 7/2012 | Owens | |
| 8,552,083 B1 * | 10/2013 | Taranekar et al. | 522/97 |
| 2001/0018162 A1 | 8/2001 | Hatakeyama et al. | |
| 2003/0068486 A1* | 4/2003 | Arney et al. | 428/323 |
| 2003/0152864 A1 | 8/2003 | Araki et al. | |
| 2003/0176583 A1 | 9/2003 | Rhodes et al. | |
| 2004/0017451 A1* | 1/2004 | Takabayashi | 347/100 |
| 2004/0072097 A1 | 4/2004 | Kodama | |
| 2004/0142272 A1 | 7/2004 | Song et al. | |
| 2004/0180287 A1* | 9/2004 | Feiring et al. | 430/270.1 |
| 2005/0191580 A1 | 9/2005 | Takahashi et al. | |
| 2005/0260522 A1* | 11/2005 | Weber et al. | 430/270.1 |
| 2005/0265685 A1 | 12/2005 | Ohashi et al. | |
| 2005/0266335 A1* | 12/2005 | Johnson et al. | 430/270.1 |
| 2006/0063102 A1 | 3/2006 | Kubota et al. | |
| 2006/0223001 A1 | 10/2006 | Nishimura et al. | |
| 2006/0255009 A1 | 11/2006 | Card et al. | |
| 2006/0257785 A1 | 11/2006 | Johnson | |
| 2007/0172761 A1* | 7/2007 | Takahashi | G03F 7/0397 430/270.1 |
| 2007/0225458 A1 | 9/2007 | Kimura et al. | |
| 2007/0243662 A1 | 10/2007 | Johnson et al. | |
| 2008/0124654 A1 | 5/2008 | Park et al. | |
| 2008/0160432 A1 | 7/2008 | Byon et al. | |
| 2008/0213549 A1* | 9/2008 | Lee | G03F 7/0233 428/195.1 |
| 2008/0299487 A1* | 12/2008 | Chang | 430/270.1 |
| 2008/0308971 A1* | 12/2008 | Liu | B82Y 10/00 264/293 |
| 2009/0011367 A1* | 1/2009 | Omatsu | B82Y 10/00 430/287.1 |
| 2009/0061364 A1* | 3/2009 | Teng | 430/432 |
| 2009/0130594 A1* | 5/2009 | Takei et al. | 430/271.1 |
| 2009/0233225 A1 | 9/2009 | Johnson et al. | |
| 2010/0233626 A1 | 9/2010 | Shimizu et al. | |
| 2010/0285227 A1 | 11/2010 | Yapel et al. | |
| 2011/0065620 A1 | 3/2011 | Owens | |
| 2011/0102528 A1 | 5/2011 | Tsuchimura et al. | |
| 2011/0104389 A1 | 5/2011 | Bryan-Brown et al. | |
| 2011/0123936 A1 | 5/2011 | Hori et al. | |
| 2011/0159252 A1* | 6/2011 | Ober et al. | 428/195.1 |
| 2012/0187548 A1 | 7/2012 | Kugler | |
| 2012/0206068 A1 | 8/2012 | Sone et al. | |
| 2013/0172476 A1 | 7/2013 | Sasamoto et al. | |
| 2015/0024326 A1* | 1/2015 | Nawrocki et al. | 430/280.1 |

FOREIGN PATENT DOCUMENTS

| | | | |
|---|---|---|---|
| EP | 0232972 | A2 | 8/1987 |
| JP | 02259762 | A | 10/1990 |
| JP | 2000089455 | A | 3/2000 |
| JP | 2003105207 | A | 4/2003 |
| JP | 2003255523 | A | 9/2003 |
| JP | 2003287890 | A | 10/2003 |
| JP | 2005140849 | A | 6/2005 |
| JP | 2005410348 | A | 6/2005 |
| JP | 2008026696 | A | 2/2008 |
| JP | 2009-265449 | * | 11/2009 |
| JP | 2010-032991 | * | 2/2010 |
| JP | 2010276694 | A | 12/2010 |
| KR | 1020090019621 | A | 2/2009 |
| WO | 2010128969 | A1 | 11/2010 |
| WO | 2011/027782 | * | 3/2011 |
| WO | 2012173721 | A1 | 12/2012 |
| WO | 2013036502 | A1 | 3/2013 |

OTHER PUBLICATIONS

Supplemental European Search Report for European Patent Application No. 12829584.7; Date of Filing: Sep. 5, 2012; Date of Compeltion Jan. 26, 2015; 10 Pages.
Onishi et al., "Acid catalyzed Resist for KrF Excimer Laser Lithography" Journal of Photopolymer Science and Technology, vol. 4, No. 3, (1991), pp. 337-340.
International Search Report From the International Searching Authority for International Application No. PCT/US2012/053738; International Filing Date: Sep. 5, 2012; Date of Mailing: Nov. 23, 2012; 1 Page.
Wang et al. "Piezoelectric Inkjet Technology, From Graphic Printing to Material Deposition" FUJIFILM Dimatix, Inc., Nanotech Conference & Expo, May 3-7, 2009. 26 Pages.
Zhou et al., "A Full Description of a Simple and Scalable Fabrication Process for Electrowetting Displays" Journal of Micromechanics and Microengineering, vol. 19, (2009), 12 Pages.
JP 2000-89455 A, Published Mar. 31, 2000; English Abstract Only, 1 page.
"3M Novec 7200 Engineered Fluid", 3M, searched on Jan. 25, 2017, Internet, http://multimedia.3m.com/mws/ media/1998190/3mtm-novectm-7200-engineered-fluid.pdf.
International Search Report issued in Application No. PCT/US2013/028827 dated May 8, 2013.
CN1934498 A English Abstract; Date of Publication: Mar. 21, 2007; 1 page.
International Preliminary Report on Patentability and Written Opinion of the International Searching Authority of International Application No. PCT/US2013/028827; Intl Filing Date: Mar. 4, 2013; Date of Mailing: May 21, 2015; 11 Pages.

* cited by examiner

EPOXY FORMULATIONS AND PROCESSES FOR FABRICATION OF RELIEF PATTERNS ON LOW SURFACE ENERGY SUBSTRATES

CROSS-REFERENCE TO RELATED APPLICATIONS

This Application is a U.S. National Stage Application of PCT/US2012/053738 filed Sep. 5, 2012 which claims priority to U.S. Provisional Patent Application 61/573,491 filed Sep. 7, 2011, both of which are incorporated by reference in their entirety.

BACKGROUND OF THE INVENTION

1. Field of the Invention

The present invention is directed to permanent, photocationically polymerizable epoxy film compositions and methods for their use in the fabrication of relief structures on low surface energy substrates.

2. Brief Description of the Related Art

Photoimageable coatings are currently used in a wide variety of micro-electromechanical systems (MEMs) technologies and applications. Microfluidics is the branch of MEMs technology that deals with the behavior, precise control and manipulation of small volumes of fluid that are geometrically constrained in small volume elements on the order of $10^{-9}$ to $10^{-15}$ liters. Microfluidics emerged as a technical discipline in the early 1980s and has found application in the fabrication of inkjet print heads, DNA sequencing chips, lab-on-a-chip technology, micro-propulsion, adaptive lenses, pixelated optical filters, and recently, display technologies for computer and mobile device applications.

The electrowetting effect provides the basis for several microfluidic device designs and concepts. The electrowetting effect is defined as the change in a solid-electrolyte solution contact angle due to the application of an applied electrical potential or voltage between the solid and the electrolyte. As an example, a water droplet resting on a hydrophobic insulator film exhibits a large contact angle due to surface tension mismatch. If the hydrophobic insulator film is positioned on top of and in contact with an electrode and then the water droplet is contacted with a separate electrode, then the contact angle of the water droplet with the hydrophobic surface will decrease when an electrical potential is applied between the two electrodes and the water droplet spreads to cover a larger area of the hydrophobic film surface. The electrowetting effect is reversible and thus upon removal of the applied electrical potential, the water droplet contact angle returns to the unbiased value.

The electrowetting effect has been elaborated into microfluidic optical switches that form the operating basis for electrowetting display devices as disclosed in U.S. Pat. Nos. 7,813,030, 7,359,108, 7,359,108, and 7,800,816. The pixel elements of these prior art display devices each comprise a microfluidic optical switch constructed as shown in FIGS. 1a and 1b (redrawn from FIGS. 1a and 1b in U.S. Pat. No. 7,800,816).

FIG. 1 shows a diagrammatic cross-section of a display device pixel element 1 which shows the principle on which an electrowetting display device is based. Between two transparent substrates or support plates 3 and 4 which may be glass or plastic, a first fluid 5 and a second fluid 6 are provided, which are immiscible with each other. For instance, the first fluid 5 may be an alkane like hexadecane or colored oil. The second fluid 6 is electroconductive or polar and may be water or a salt solution. In the device off state, when no external voltage is applied (FIG. 1a), the fluids 5 and 6 adjoin the first and second transparent support plates 3 and 4. On the first support plate 3 a transparent electrode 7, for example indium (tin) oxide is provided and an intermediate less wettable (hydrophobic) layer 8, for example an amorphous fluoropolymer, is provided as a coating on transparent electrode 7.

When a voltage is applied (voltage source 9) via interconnections 20 and 21 the layer of fluid 5 moves aside or breaks up into small droplets (FIG. 1b, on state). This occurs when the electrostatic energy gain is larger than the surface energy loss due to the creation of curved surfaces. As a very important aspect, it was found that reversible switching between a continuous film of fluid 5 covering the support plate 3 and a film of fluid 5 adjoining the pixel wall 2 is achieved by means of the electrical switching means (voltage source 9).

Optical switching is obtained when light incident on the devices according to FIG. 1 is reflected from reflector 10 as in FIG. 1b to provide reflected light 12. In the device off state according to FIG. 1b, the incident light is not reflected and the pixel appears dark to an observer.

Negative-tone, photosensitive epoxy coating compositions such as SU-8, a product of MicroChem. Corp., have found utility as a material for fabricating electrowettable display pixel sidewalls (2 in FIG. 1a) as described in Heikenfeld, J., et. al., *J. Micromech. Microeng.*, 19 (2009) pp 1-12. In order to fabricate pixel side walls, the photosensitive epoxy composition must be coated on the hydrophobic layer (8 in FIG. 1b). In most electrowettable display implementations, the hydrophobic layer is a low surface energy polymer and fluoropolymers are commonly used. Consequently, it is difficult to form coatings of solvent-cast photosensitive epoxy compositions on such low surface energy substrates due to the large mismatch in surface energy between the epoxy composition and the hydrophobic substrate which leads to coating defects and poor coating adhesion. This problem has been mitigated by treating the hydrophobic layer using methods such as corona discharge, UV-ozone, or oxygen reactive ion etch that increase the surface energy of the hydrophobic layer and thus provide an activated surface to promote wetting and adhesion of the photoepoxy composition. A consequence of such treatments is that the surface energy of the activated hydrophobic layer must be reduced to restore the surface energy of the hydrophobic layer to a value that permits proper function of the electrowetting device. This may be accomplished by baking the hydrophobic layer at an elevated temperature. It should be noted that the bake temperature may be constrained by the characteristics of the transparent support plate 3 which in the case of plastics such as polyethylene terephthalate and polyethylene naphthalate, constrain the bake temperature to values less than the deformation temperature of such plastic support plate materials.

The process steps of hydrophobic layer activation and subsequent annealing results in increased process complexity and cost. Accordingly, there exists a need for negative-tone photosensitive epoxy compositions whose processing on hydrophobic layers does not require the use of hydrophobic layer surface activation methods. It is therefore an object of the present invention to provide negative-tone photosensitive epoxy compositions and processes for their use that eliminates the need for hydrophobic layer activation.

SUMMARY OF THE INVENTION

The present invention relates to permanent epoxy photoresist compositions and the permanent cured products thereof that are useful in the fabrication of MEMS (microelectromechanical system) components, micromachine components, μ-TAS (micro-total analytical system) components, microreactor components, dielectric layers, electrowetting microfluidic devices, and the like that are capable of being patterned using ultraviolet lithographic methods wherein the photoresist relief structure is formed on a low surface energy polymer substrate. The invention further relates to permanent epoxy photoresist compositions and the cured products thereof in which the cured product has high strength, excellent adhesion, resistance to cracking and crazing, excellent chemical resistance to acids, bases, and solvents, good heat resistance, and good electrical properties.

Therefore, one aspect of the present invention is directed to providing permanent epoxy photoresist compositions useful for making negative-tone, permanent photoresist relief patterns on low surface energy polymer substrates comprising:
(A) one or more epoxy resins; and,
(B) one or more cationic photoinitiators; and
(C) one or more film casting solvents; and
(D) one or more fluorinated compounds.

In addition to components (A) through (D) inclusively, the compositions according to the invention can optionally comprise one or more of the following additive materials:

(E) one or more surfactants, (F) one or more optional epoxy resins; (G) one or more reactive monomers; (H) one or more photosensitizers; (I) one or more adhesion promoters: and (J) one or more light absorbing compounds including dyes and pigments. In addition to components (A) through (J) inclusively, the compositions according to the invention can also optionally comprise additional materials including, without limitation, thermal acid generator compounds flow control agents, thermoplastic and thermosetting organic polymers and resins, inorganic filler materials, and radical photoinitiators.

The epoxy resins (A) may, for example, comprise one or more epoxy resins according to Formula I through Formula VI:

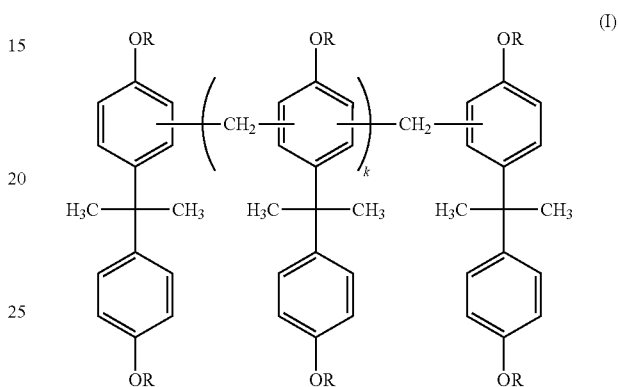

wherein each group R in Formula I is individually selected from glycidyl or hydrogen and k in Formula I is a real number ranging from 0 to about 30;

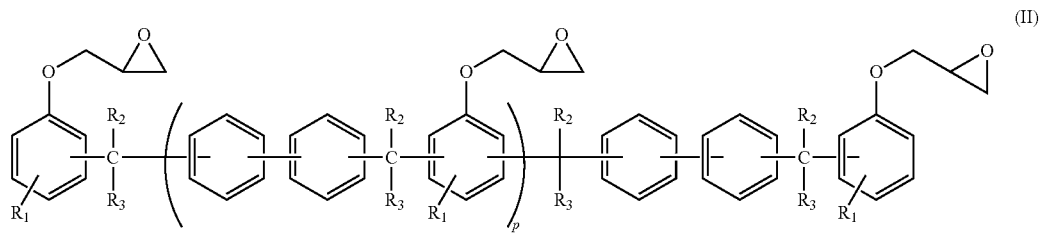

wherein each $R_1$, $R_2$ and $R_3$ in Formula II are independently selected from the group consisting of hydrogen or alkyl groups having 1 to 4 carbon atoms and the value of p in Formula II is a real number ranging from 1 to about 30;

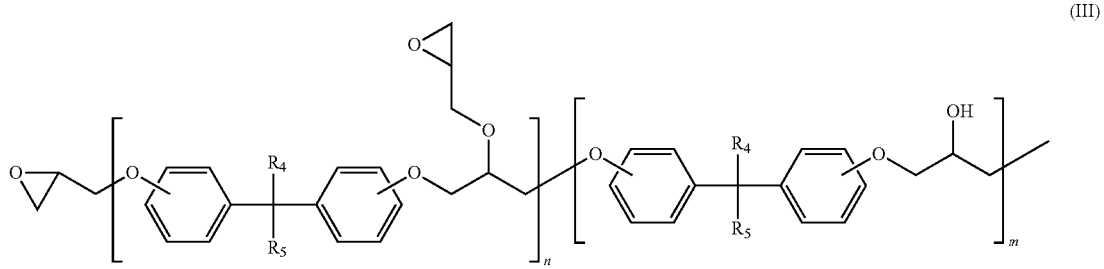

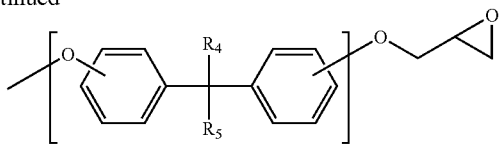

wherein each $R_4$ and $R_5$ in Formula III are independently selected for the group consisting of hydrogen, alkyl groups having 1 to 4 carbon atoms, or trifluoromethyl groups and the values of n and m in Formula III are independently real numbers ranging from 1 to about 30;

(IV)

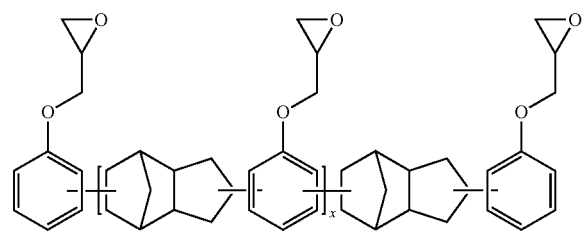

wherein x in Formula IV is a real number ranging from 1 to about 30;

(V)

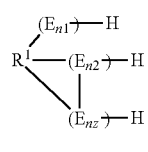

(E₁)

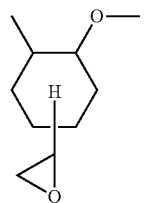

(E₂)

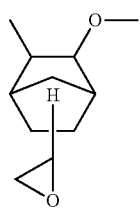

wherein $R_1$ in Formula V represents a residue of an organic compound having z active hydrogen atoms, $n_1$ through $n_z$ each represents 0 or an integer from 1 to 100, the sum of the integers represented by $n_1$ through $n_z$ is from 1 to 100, z represents an integer from 1 to 100 and E represents separately either groups $E_1$ or $E_2$; and (VI)

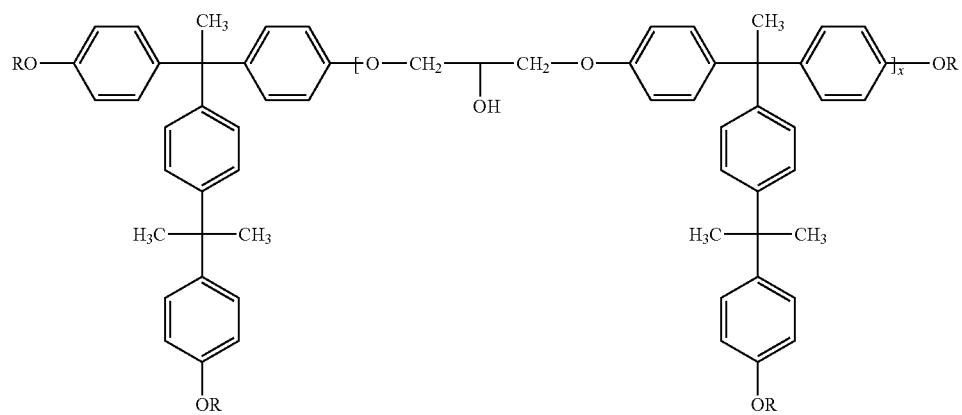

wherein each group R in Formula VI is individually selected from glycidyl or hydrogen and x in Formula VI is a real number ranging from 0 to about 30.

Another aspect of the present invention is directed to a method of forming a permanent photoresist relief pattern on a low surface energy polymer substrate comprising the process steps of: (1) providing a low surface energy polymer layer on a substrate by coating a low surface energy polymer solution on the substrate, (2) forming a layer of any of the photoresist compositions according to the invention on the low surface energy polymer substrate; (3) evaporating most of the solvent from the photoresist layer by heating the coated substrate to form a film of the photoresist composition on the substrate; (4) irradiating the photoresist film with active rays through a mask; (5) crosslinking the irradiated photoresist film segments by heating; (6) developing the mask image in the photoresist film with a solvent to form an negative-tone relief image of the mask in the photoresist film; and (7) heat-treating the photoresist relief structure to further cure the photoresist and low surface energy polymer layers.

Still another aspect of the present invention is directed to providing a photoresist relief structure on a low surface energy polymer substrate wherein the substrate areas not covered by the photoresist relief pattern retain the hydrophobic surface activity needed for successful operation of electrowetting devices.

BRIEF DESCRIPTION OF THE FIGURES

The following description of the invention will be better understood when taken in conjunction with the following figures wherein:

FIG. 2b shows a higher magnification view of the pixel wall pattern shown in FIG. 2a.

FIG. 3b shows a higher magnification view of the pixel wall pattern shown in FIG. 3a.

DETAILED DESCRIPTION OF THE INVENTION

Figure 1A:
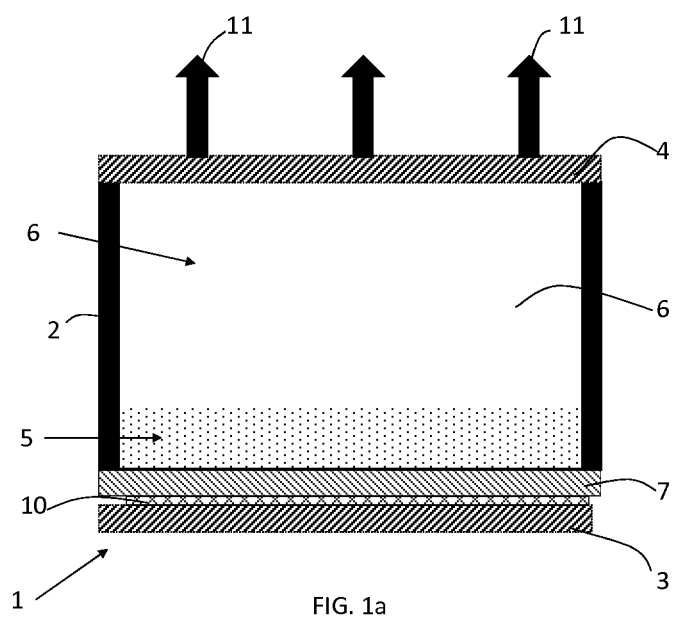
FIG. 1a depicts a schematic cross section of an electrowettable display pixel element of the prior art in the off-state.
Figure 1B:
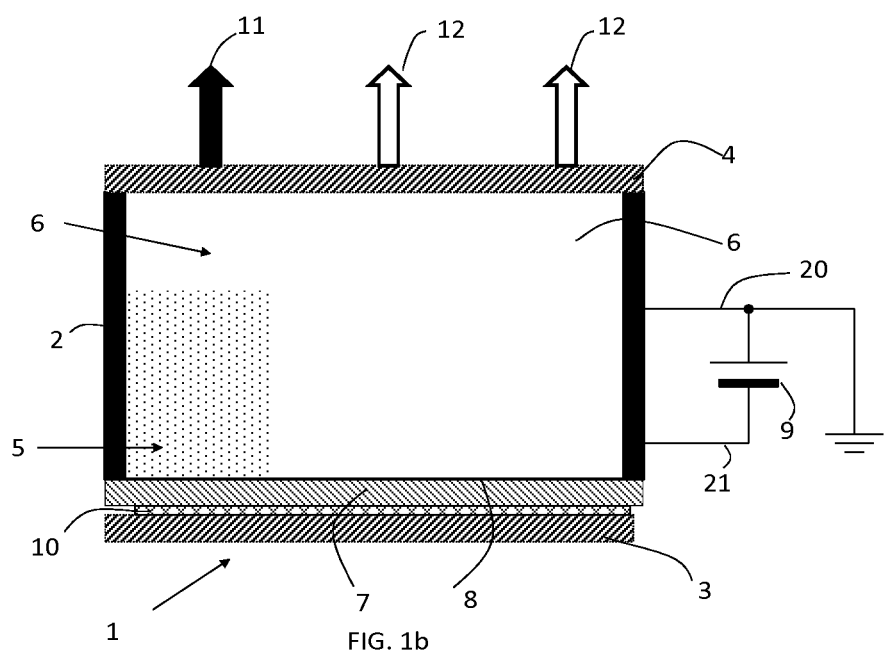
FIG. 1b depicts a schematic cross section of an electrowettable display pixel element of the prior art in the on-state.

In the art related to photoimageable compositions, photoresists are generally understood to be temporary coatings that are used to selectively protect one area of a substrate from another such that the operation of a subsequent process takes place only in an area of the substrate that is not covered by the photoresist. Once this subsequent operation has been completed, the photoresist is removed. Thus, the properties of such temporary photoresist coatings need be only those required to obtain the required image profile and be resistant to the action of the subsequent process steps. However, the present invention addresses applications wherein the photoresist layer is not removed and is used as a permanent structural component of the device being fabricated. In the case of use of the photoresist as a permanent layer, the material properties of the photoresist film must be compatible with the intended function and end use of the device. Therefore, photoimageable layers that remain as a permanent part of the device are termed herein as permanent photoresists.

The permanent photoresist composition of the present invention is comprised of: one or more epoxy resins such as the resins described by Formulas I through VI (A); one or more cationic photoinitiators (B); one or more film casting solvents (C); and one or more fluorinated compounds (D) as well as optional additives.

In one embodiment, the epoxy resins (A) may have the structure shown in Formula I:

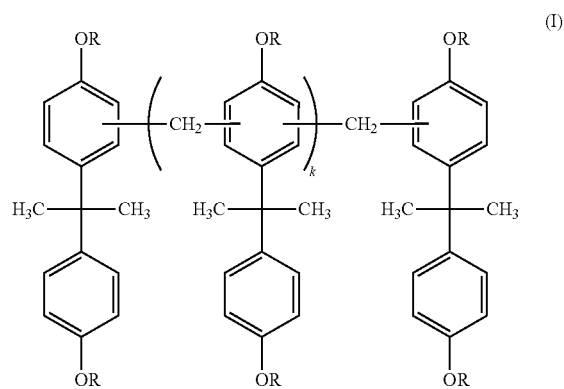

wherein each group R in Formula I is individually selected from glycidyl or hydrogen and k in Formula I is a real number ranging from 0 to about 30;

Epoxy resins (A) according to Formula I that are suitable for use in the present invention are bisphenol A novolac epoxy resins that can be obtained by reacting a bisphenol A novolac resin and epichlorohydrin. Resins having a weight average molecular weight ranging from 2000 to 11000 are preferred and resins with a weight average molecular weight ranging from 4000 to 7000 are particularly preferred. Epicoat® 157 (epoxide equivalent weight of 180 to 250 and a softening point of 80-90° C. made by Japan Epoxy Resin Co., Ltd. Tokyo, Japan, and EPON® SU-8 Resin (epoxide equivalent weight of 195 to 230 g/eq and a softening point of 80 to 90° C.) made by Momentive Specialty Chemicals, Columbus, Ohio and the like are cited as preferred examples of bisphenol A novolac epoxy resins suitable for use in the present invention.

In another embodiment, the epoxy resins (A) may have the structure shown in Formulas II and III:

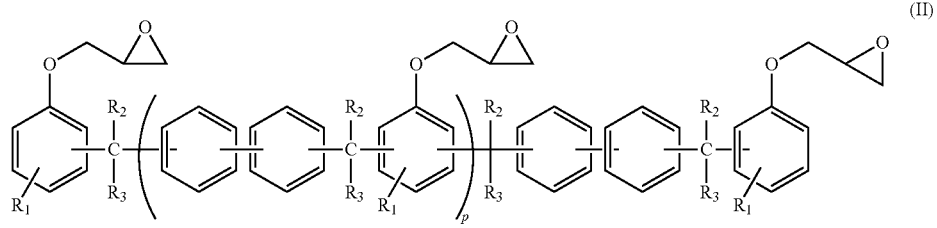

wherein each $R_1$, $R_2$ and $R_3$ in Formula II are independently selected from the group consisting of hydrogen or alkyl groups having 1 to 4 carbon atoms and the value of p in Formula II is a real number ranging from 1 to about 30;

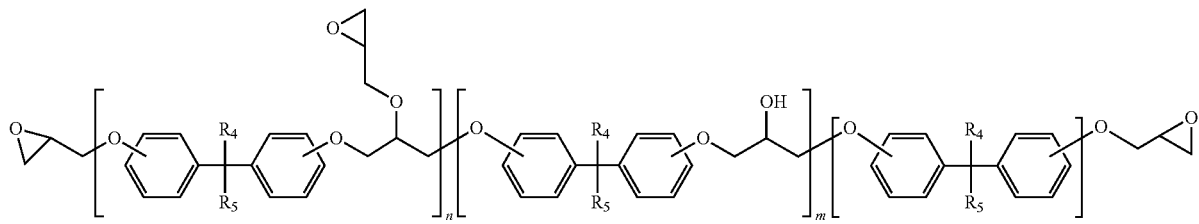

(III)

wherein each $R_4$ and $R_5$ in Formula III are independently selected for the group consisting of hydrogen, alkyl groups having 1 to 4 carbon atoms, or trifluoromethyl groups and the values of n and m in Formula III are independently real numbers ranging from 1 to about 30;

Epoxy resins (A) according to Formulas II and III are flexible and strong and are capable of giving these same properties to the patterned photoresist film. Examples of epoxy resins according to Formula II that can be used in the present invention are the epoxy resins according to Japanese Kokai Patent No. Hei 9 (1997)-169,834 that can be obtained by reacting di(methoxymethylphenyl) and phenol and then reacting epichlorohydrin with the resin that is obtained. An example of a commercial epoxy resin according to Formula II is epoxy resin NC-3000 (epoxide equivalent weight of 270 to 300 g/eq and a softening point of 55 to 75° C.) made by Nippon Kayaku Co., Ltd. Tokyo, Japan, and the like are cited as examples. It should be noted that the value of n in Formula II is calculated by an inverse operation from the resin epoxy equivalent, and a number of 1 or higher, preferably a number of 1 to 10, is the average value. It is to be understood that more than one epoxy resin according to Formula II can be used.

The epoxy resins of Formula III may be obtained by reaction of the alcoholic hydroxyl groups of bisphenol-epichlorohydrin polycondensates with epichlorohydrin. Specific examples of epoxy resins III that may be used in the invention are NER-7604, NER-7403, NER-1302, and NER 7516 resins manufactured by Nippon-Kayaku Co., Ltd, Tokyo, Japan and EX 2177 resin manufactured by Epoxonics, GmbH. The epoxide equivalent weight of the epoxy resins according to Formula III is preferably 200 to about 600 and their softening point is preferably 40 to 90° C. It is to be understood that more than one epoxy resin according to Formula III can be used.

In another embodiment, the epoxy resins (A) may have the structure shown in Formula IV:

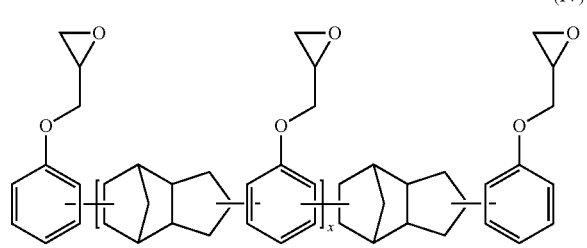

(IV)

wherein x in Formula IV is a real number ranging from 1 to about 30;

The epoxy resins of Formula IV include XD-1000 resin manufactured by Nippon-Kayaku Co., Ltd, Tokyo, Japan. XD-1000 has an epoxide equivalent weight of about 252 and a softening point of 74° C.

In another embodiment, the epoxy resins (A) may have the structure shown in Formula V:

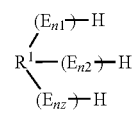

(V)

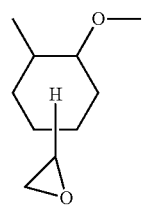

($E_1$)

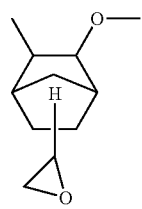

($E_2$)

wherein $R_1$ in Formula V represents a residue of an organic compound having z active hydrogen atoms, $n_1$ through $n_z$ each represents 0 or an integer from 1 to 100, the sum of the integers represented by $n_1$ through $n_z$ is from 1 to 100, z represents an integer from 1 to 100 and E represents separately either groups $E_1$ or $E_2$;

The epoxy resins of Formula V are cycloaliphatic epoxies as disclosed in U.S. Pat. Nos. 4,565,859 and 4,841,017 wherein vinyl substituted alicyclic epoxide monomers are copolymerized with a compound containing a least one active hydrogen atom to produce a vinyl substituted polyether that is subsequently oxidized with a peracid to produce the alicyclic epoxy resin. A preferred commercial example is EHPE 3150 epoxy resin which has an epoxide equivalent weight of 170 to 190 g/eq and is manufactured by Daicel Chemical Industries, Ltd., Osaka, Japan.

In yet another embodiment, the epoxy resins (A) may have the structure shown in Formula VI:

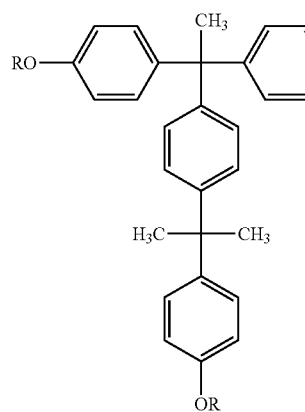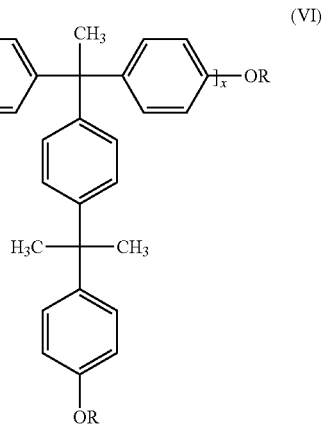

(VI)

wherein each group R in Formula VI is individually selected from glycidyl or hydrogen and x in Formula VI is a real number ranging from 0 to about 30.

The epoxy resins of Formula VI are useful in compositions requiring improved oxidative stability. A preferred commercial example is NC 6300H manufactured by Nippon-Kayaku Co., Ltd, Tokyo, Japan.

The epoxy resins (A) described by Formulas I-VI may be used singly or in combinations of two or more.

Compounds that generate an acidic species when irradiated by active rays, such as ultraviolet radiation, X-rays, light, and the like, are preferred as the cationic photoinitiator (B) used in the present invention. The cationic photoinitiator compounds (B) are also referred to in the formulation art as photoacid generators or PAG(s). Aromatic iodonium complex salts and aromatic sulfonium complex salts are cited as examples. Di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, and the like are cited as specific examples of the aromatic iodonium complex salts that can be used. Moreover, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenylsulfide bis-hexafluorophosphate, 4,4'-bis[di(β-hydroxyethoxy)phenylsulfonium]diphenylsulfide bis-hexafluoroantimonate, 4,4'-bis[di(β-hydroxyethoxy)(phenylsulfonium)diphenyl sulfide-bishexafluorophosphate 7-[di(p-tolyl)sulfonium]-2-isopropylthioxanthone hexafluorophosphate, 7-[di(p-tolyl)sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenylsulfide tetrakis(pentafluorophenyl)borate, diphenyl[4-(phenylthio)phenyl]sulfonium hexafluoroantimonate and the like can be cited as specific examples of the aromatic sulfonium complex salts that can be used. CYRACURE 6976 (mixed aromatic sulfonium hexafluoroantimonate salts) available from Dow is an example of a useful photoacid generator. Irgacure PAG 290 and GSID26-1 available from BASF are examples of useful photoacid generator compounds that do not contain antimony. Other suitable photocationic initiators include sulfonated esters and sulfonyloxy ketones may also be used. See *J. Photopolymer Science and Technology*, 4(3):337-340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonated cationic photoinitiators are also disclosed in U.S. Pat. No. 5,344,742.

Other useful acid generators include nitrobenzyl esters and s-triazine derivatives. Suitable s-triazine acid generators are disclosed, for example, in U.S. Pat. No. 4,189,323. Halogenated non-ionic, photoacid generating compounds also may be suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl) benzhydrol (Kelthane): hexachlorodimethyl sulfone; 2-chloro-6-(trichloromethyl)pyridine; o,o-diethyl-o-(3,5,6-trichloro-2-pyridyl) phosphorothionate; 1,2,3,4,5,6-hexachlorocyclohexane; N-(1,1-bis[p-chlorophenyl]-2,2,2-trichloroethyl)acetamide, tris[2,3-dibromopropyl] isocyanurate; 2,2-bis[p-chlorophenyl]1,1-dichloroethylene; tris[trichloromethyl]-s-triazine; and their isomers, analogs, homo logs, and residual compounds. Suitable photoacid generators are also disclosed in European Patent Application Nos. 0164248 and 0232972.

The cationic photoinitiators (B) can be used alone or as mixtures of two or more compounds.

A film casting solvent (C) is used in the present invention and any solvent can be used as long as it is an organic solvent capable of dissolving the other components in the composition so that a coating can be formed and dried on a substrate. Examples of ketone solvents that can be used include acetone, 2-butanone, 2-pentanone, 3-pentanone, methyl isobutyl ketone, methyl t-butyl ketone, methyl ethyl ketone, cyclopentanone, cyclohexanone, and the like. Examples of ether solvents that can be used include dipropylene glycol dimethyl ether, tetrahydrofuran, 1,3-dioxolane, 1,4-dioxane, 1,2-dimethoxyethane, and diglyme.

Examples of ester solvents that can be used include methyl acetate, ethyl acetate, butyl acetate, ethylene glycol monobutyl ether acetate, diethylene glycol monomethyl ether acetate, propylene glycol monomethyl ether acetate, gamma-butyrolactone, and the like. Examples of carbonate solvents that may be used include dimethyl carbonate and propylene carbonate. Examples of aromatic and aliphatic hydrocarbon solvents that can be used in minor amounts in a solvent mixture containing a major amount of one or more solvents selected from the group comprising ketone, ester, or ether solvents include toluene, xylene, 1,2,4,5-tetramethylbenzene, octane, decane, petroleum distillates, and the like. When used in combination with ketone, ester, or ether solvents, these hydrocarbon solvents can be used alone or as a mixture of two or more hydrocarbon solvents.

Solvents and solvent mixtures are selected according to the engineering demands of a particular application and the available process equipment such that the desired composition viscosity and drying characteristics are obtained.

A fluorinated compound (D) is used in the present invention. Fluorinated compounds suitable for use are generally organic compounds in which either all or a majority of the carbon valences not comprising carbon to carbon bonds are carbon to fluorine bonds. The fluorinated compounds are generally liquids with surface tensions less than 20 dyn/cm that may be further characterized by means of their Hansen solubility parameters wherein the dispersion solubility parameter ($\delta_D$) of the fluorinated compounds ranges from 8 to about 15, the polar solubility parameter ($\delta_P$) of the fluorinated compound ranges from 0 to about 2, and the hydrogen bonding solubility parameter ($\delta_D$) of the fluorinated compound ranges from 0 to about 2. Suitable fluorinated compounds include, but are not limited to, perfluorohexane, perfluorooctane, perfluorodecalin, 2,3-dihydrofluoropentane, hexafluorobenzene, HFC 338 pcc (octafluorobutane), HFC-365mfc (pentafluorobutane), perfluorodimethylcyclohexane, perfluoroheptane, perfluoromethylcyclohexane, perfluoropentane, furan, 2,2,3,4,4,5-hexafluorotetrahydro-3-(pentafluoroethyl)-5-(trifluoromethyl)-cis-, furan, 2,2,3,4,4,5-hexafluorotetrahydro-3-(pentafluoroethyl)-5-(trifluoromethyl)-, trans-, furan, 2,2,3,4,4,5-hexafluorotetrahydro-5-(pentafluoroethyl)-3-(trifluoromethyl)-, trans-, furan, 2,2,3,4,4,5-hexafluorotetrahydro-5-(pentafluoroethyl)-3-(trifluoromethyl)-, cis-, furan, 2,3,3,4,4,5-hexafluorotetrahydro-2-(pentafluoroethyl)-5-(trifluoromethyl)-, 2h-cyclopenta[b]furan, 2,2,3,3a,4,4,5,5,6,6,6a-undecafluorohexahydro-3-(trifluoromethyl)-, furan, 2,2,3,4,4,5-hexafluorotetrahydro-3,5-bis(pentafluoroethyl)-, furan, 2,2,3,4,4,5-hexafluoro-3-(heptafluoropropyl)tetrahydro-5-(trifluoromethyl)-, furan, 2,2,3,4,4,5-hexafluoro-5-(heptafluoropropyl)tetrahydro-3-(trifluoromethyl)-, trans-, furan, 2,2,3,4,4,5-hexafluoro-5-(heptafluoropropyl)tetrahydro-3-(trifluoromethyl)-, cis-, furan, 2,3,3,4,4,5-hexafluoro-2-(heptafluoropropyl)tetrahydro-5-(trifluoromethyl)-, 1,1,1,2,2,3,3,4,4-nonafluorohexane, perfluoromethylcyclopentane, dodecafluorodimethylcyclobutane, 1h,1h,2h-perfluoro-1-decene, perfluoro-1,3-dimethylcyclohexane, 1 h-perfluoroheptane, perfluoroheptene-1,6h-perfluorohexane, perfluoromethyldecalin, perfluorooctene-1,1h,1h,2h-perfluoro-1-octene, perfluorononane, perfluorodecane, 1,1,1,2,2,3,3,4,4,5,5,6,6-tridecafluoro-6-methoxy-hexane, 2-difluoromethylperfluorooxolane, and fluorinated liquids such as perfluorocarbon liquids sold under the trade names FC-40, FC-43, FC-72, FC-77, FC-84; Novec® HFE-7100, Novec® HFE-7200, and Novec® HFE-7300 (mixtures of methyl nonafluoroisobutyl ether and methyl nonafluorobutyl ether) manufactured by the 3M Company The fluorinated compounds according to the invention may be used in mixtures of two or more compounds.

Optionally, it may be beneficial in certain embodiments to include a surfactant compound (E) in the composition to improve coating uniformity and surface finish. Examples of suitable surfactants include fluorinated poly(oxetane) polymers from Omnova Solutions and specific examples include fluorinated poly(oxetane) polymers sold under the trade names PF-6320, PF-6520, and PF 7002. Other suitable materials are the Capstone® fluorosurfactants sold under the trade names FS-22, FS-65, and FS-83, Zonyl® fluorosurfactants sold under the trade names FSA, FSJ, FSN, FSO, and FSP made by the Dupont Company, as well as acrylic surface leveling agents sold under the trade names Disparlon® 1970 and 230 and manufactured by Kusumoto Chemicals, Ltd., Tokyo, Japan.

Optionally, it may be beneficial in certain embodiments to use an additional epoxy resin (F) in the composition wherein optional epoxy resin (F) is an epoxy resin other than a resin described by Formulas I through VI. Depending on its chemical structure, optional epoxy resin F may be used to adjust the lithographic contrast of the photoresist or to modify the optical absorbance of the photoresist film. The optional epoxy resin F may have an epoxide equivalent weight ranging from 160 to 800 grams resin per equivalent of epoxide. Examples of optional epoxy resins suitable for use include EOCN 4400, an epoxy cresol-novolac resin with an epoxide equivalent weight of about 195 g/eq manufactured by Nippon Kayaku Co., Ltd., Tokyo, Japan Optionally, it may be beneficial in certain embodiments to use a reactive monomer compound (G) in the compositions according to the invention. Inclusion of reactive monomers in the composition helps to increase the flexibility of the uncured film. Glycidyl ethers containing two or more glycidyl ether groups are examples of reactive monomer (G) that can be used. Compounds with two or more glycidyl groups are preferred and diethylene glycol diglycidyl ether, propylene glycol diglycidyl ether, polypropylene glycol diglycidyl ether, hexanediol diglycidyl ether, trimethylolpropane triglycidyl ether, pentaerythritol tetraglycidyl ether, and the like are cited as examples. The glycidyl ethers can be used alone or as mixtures of two or more. Trimethylolpropane triglycidyl ether and propylene glycol diglycidyl ether are preferred examples of reactive monomers (H) that can be used in the invention.

Certain glycidated polysilsesquioxane compounds such as octaglycidyldimethylsilyl polyhedral oligomeric silsesquioxane manufactured by Hybrid Plastics Inc. under the trade name EP0435 are another group of reactive monomers (G) that can be used in the present invention.

Aliphatic and aromatic monofunctional and/or polyfunctional oxetane compounds are another group of optional reactive monomers (G) that can be used in the present invention. Specific examples of the aliphatic or aromatic oxetane reactive monomers that can be used include 3-ethyl-3-hydroxymethyloxetane, 3-ethyl-3-phenoxymethyloxetane, xylylene dioxetane, bis(3-ethyl-3-oxetanylmethyl) ether, OXT 221 manufactured by Toa Gosei Co. Ltd., and the like. These monofunctional and/or polyfunctional oxetane compounds can be used alone or as mixtures of two or more.

Alicyclic epoxy compounds can also be used as reactive monomer (G) in this invention and 3,4-epoxycyclohexylmethyl methacrylate and 3,4-epoxycyclohexylmethyl-3',4'-epoxycyclohexane carboxylate may be cited as examples.

The optional reactive monomer compounds (G) may be used singly or as mixtures of two or more compounds.

Optionally, it may be useful to include photosensitizer compounds (H) in the composition so that more ultraviolet rays are absorbed and the energy that has been absorbed is transferred to the cationic photopolymerization initiator (PAG). Consequently, the process time for exposure is decreased. Anthracene, N-alkyl carbazole, and halo-fluorone compounds are examples of photosensitizers that can be used in the invention.

Anthracene compounds with alkoxy groups at positions 9 and 10 (9,10-dialkoxyanthracenes) are preferred photosensitizers (H). C1 to C4 alkoxy groups such as methoxy, ethoxy, propoxy, and butoxy groups are cited as the preferred alkoxy groups. The 9,10-dialkoxyanthracenes can also have substituent groups. Halogen atoms such as fluorine atoms, chlorine atoms, bromine atoms, and iodine atoms, C1 to C4 alkyl groups such as methyl groups, ethyl groups, and propyl groups, sulfonic acid groups, sulfonate ester groups, carboxylic acid alkyl ester groups, and the like are cited as examples of substituent groups. C1 to C4 alkyls, such as methyl, ethyl, and propyl, are given as examples of the alkyl moiety in the sulfonic acid alkyl ester groups and carboxylic acid alkyl ester groups. The substitution position of these substituent groups is preferably at position 2 of the anthracene ring system. 9,10-Dimethoxyanthracene, 9,10-diethoxyanthracene, 9,10-dipropoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulonic acid, 9,10-dimethoxyanthracene-2-sulfonic acid methyl ester, 9,10-diethoxyanthracene-2-sulfonic acid methyl ester, 9,10-dimethoxyanthracene 2-carboxylic acid, 9,10-dimethoxyanthracene-2-carboxylic acid methyl ester, and the like can be cited as specific examples of the 9,10-dialkoxyanthracenes that can be used in the present invention.

A photosensitizer termed AN910E, a product of Spectra Group Limited, is a further example of a suitable photosensitizer.

Examples of N-alkyl carbazole compounds useful in the invention include N-ethyl carbazole, N-ethyl-3-formyl-carbazole, 1,4,5,8,9-pentamethyl-carbazole, N-ethyl-3,6-dibenzoyl-9-ethylcarbazole and 9,9'-diethyl-3,3'-bicarbazole. Examples of halo-fluorone photosensitizers include 5,7-diiodo-3-butoxy-6-fluorone, 3-hydroxy-2,4,5,7-tetraiodo-6-fluorone, and 9-cyano-3-hydroxy-2,3,5,7-tetraiodo-6-fluorone and additional fluorone compounds are disclosed in U.S. Pat. Nos. 5,395,862 and 5,451,343, incorporated herein by reference. The sensitizer compounds (H) can be used alone or in mixtures of two or more.

Examples of optional adhesion promoting compounds (I) that can be used in the invention include: 3-glycidoxypropyltrimethoxysilane, 3-glycidoxypropyltriethoxysilane, 3-mercaptopropyltrimethoxysilane, vinyltriethyoxysilane, and the like.

Optionally, it may be useful to include compounds (J) that absorb actinic rays. Such compounds can be used to provide a relief image cross section that has a reverse tapered shape such that the imaged material at the top of the image is wider than the imaged material at the bottom of the image. Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, azo dyes such as p-phenylazoresorcinol and 4,4'[oxybis(p-phenoleneazo)]diphenol, coumarin compounds such as 4-methyl-7-diethylamino-1-benzopyran-2-one, thioxanthone compounds such as diethylthioxanthone, 2-isopropyl thioxanthone, and 4-isopropyl thioxanthone, 1-chloro-4-propoxy-thioxanthone, thioxanthone compounds according to U.S. Pat. Nos. 4,585,876 and 4,681,959 hereby incorporated by reference, stilbene compounds, naphthalic acid compounds, and the like are cited as specific examples of the compounds (J) that can be used in the present invention either singly or as mixtures.

In certain embodiments, it may be advantageous to include optional dye components (J) that add opacity to the final structures made from the composition of the invention. Dye components J used for this purpose are ionic and have the general structure $C^+D^-$, where $C^+$ is the cationic species and $D^-$ is the anionic species. Suitable cationic species for the dye include cyanine cation, aminoanthroquinone cation, azine cation, rhodamine cation, fushin cation, xanthene cation, and combinations thereof. The light-absorbing dyes are incorporated into the patterning formulations depending on technology application, from optical densities (O.D.) of 0.05/micron up to 4/micron, at either a preferred wavelength maximum, or over a broad wavelength maxima range, depending on the light blocking requirements of the film.

Examples of useful cationic dye species include cationic cyanine dyes according to Formula VII and Formula VIII:

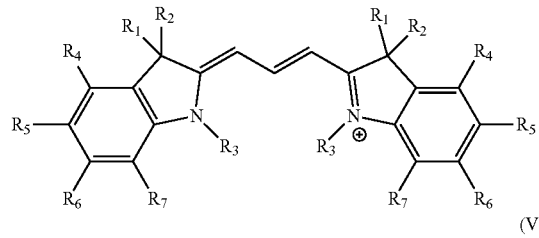

(VII)

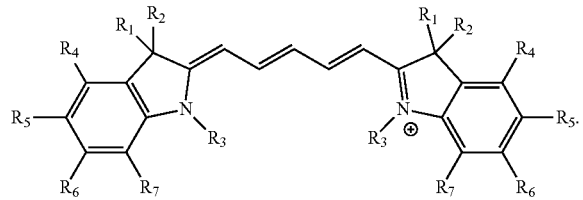

(VIII)

In Formulas VII and VIII, $R_1$ and $R_2$ may be independently H or any alkyl or isoalkyl group such as methyl, ethyl, propyl, isobutyl, sec-butyl, and the like. $R_3$, $R_4$, $R_5$, $R_6$ and $R_7$ may be independently H or any $C_1$ to $C_{18}$ alkyl or isoalkyl group, an aromatic (e.g., $C_6H_5$) group, or an aromatic group substituted with one or more $C_1$ to $C_{18}$ alkyl substituents and/or one or more halogen substituents.

The bridge structures between the two aromatic ring structures in Formulas VII and VIII above can vary in length as shown in Formula IX, Formula X, and Formula XI. The length of such bridge structure can be varied as a function of synthesis, and confers the required wavelength absorbance needed from the dye structure. The longer the bridge structure, the longer is the wavelength absorbance ($\lambda_{max}$) of the dye structure.

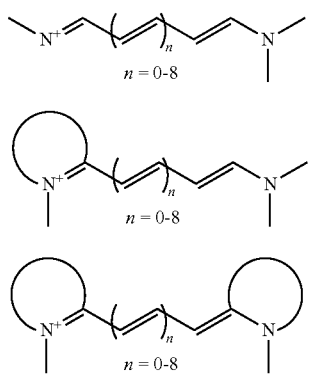

Additional useful cationic dye species include cationic cyanines of triphenylmethane according to Formula XII, cationic cyanines of thiazines according to Formula XIII, and cationic cyanines of oxazines according to Formula XIV

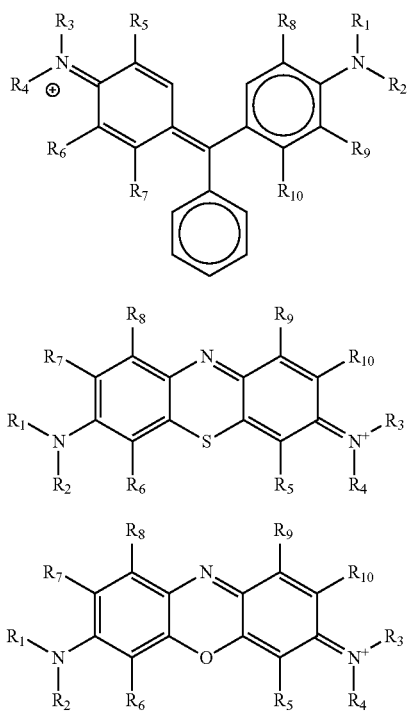

In the above Formulas XII-XIV, each of $R_1$, $R_2$, $R_3$, $R_4$, $R_5$, $R_6$, $R_7$, $R_8$, $R_9$, and $R_{10}$ are independently selected from H, $C_1$-$C_{12}$ alkyl, alkaryl, haloalkyl, thioalkyl, thioalkaryl, haloalkaryl, hydroxyalkyl, hydroxyalkaryl, alkoxy, alkoxyaryl, branched $C_1$-$C_{12}$ polyalkoxy, and branched $C_1$-$C_{12}$ polyalkoxyaryl.

The anionic species $D^-$ of the dye component may be selected, for example, from $SbF_6^-$, $BF_4^-$, $PF_6^-$, $AsF_6^-$, $(CF_3SO_2)_3C^-$, $(CF_3CF_2)_3PF_3^-$, $(C_6F_5)_4B^-$, as well as combinations thereof. As will be appreciated by one of skill in the art, combinations of two, three, four, or more dyes may also be used in the present invention.

According to the invention, the anionic species of the dye component (D) must be structurally identical to the anionic species of the PAG component ($B^-$), or be of equivalent basicity, such that the acid produced during photolysis is not compromised by the stronger basic counter ion of the dye. As defined herein, "equivalent basicity" means using a dye anion which does not slow lithographic film photospeed beyond that expected from increased film absorbance at 365 nm. Thus, for example, if a hexafluoroantimonate anion is chosen as the anionic species for the photoacid generator, then they dye component must also have hexafluoroantimonate as the anionic species, or its basic equivalent. The dye preferably has an absorbance range from 290 to 1500 nm and corresponds to the wavelengths of light that are to be absorbed. The dye is also transparent in a selected range of wavelengths corresponding to the demands of the application. As defined herein, "transparent" means >70% UV-Visible transmittance. Useful amounts of the ionic dye component in the composition of the invention preferably range from 0.25-50 wt %, and more preferably from 0.5-20 wt %, based on the total weight of the epoxy-phenolic resin.

A commercial example of a suitable cationic dye is FHI 5482 manufactured by Fabricolor Holding International, LLC.

Alternatively and in certain embodiments, it may advantageous to include a thermal acid generating compound or TAG as an optional component in the composition. A variety of known TAG compounds may be used for this purpose and examples include CXC 1612, 2,4,4,6-tetrabromocyclohexadienone, benzoin tosylate, 2-nitrobenzyl tosylate and other alkyl esters of organic sulfonic acids. Compounds that generate a sulfonic acid upon thermal activation are generally suitable.

The amount of epoxy resin (A) that may be used is 5-99.9 weight % of the total weight of components A and B and, where present, optional epoxy resin F, optional reactive monomer G, and optional adhesion promoter I, and more preferably 20-99.9 weight % and most preferably 40-99.9%. The epoxy resins according to Formulas I-IV are particularly preferred but it should be understood that epoxy resins other than those resins described by Formulas I-IV may be used in the compositions according to the invention.

The amount of photoacid generator compound (B) that may be used is 0.1 to 10 weight % of the total weight of the epoxy resin component (A), and where present, optional epoxy resin F, optional reactive monomer G, and optional adhesion promoter I. It is more preferred to use 1-8 weight % of B and it is most preferred to use 2-8 weight %.

The amount of solvent component C that may be used is 5 to 99 weight percent of the total composition. It is more preferred to use 5 to 90 weight percent solvent and most preferred to use 10-85 weight % solvent. The exact amount of solvent that may be used depends on the desired coating thickness. Compositions containing lower amounts of solvent provide higher solids concentrations and are useful for preparing thick film while greater amounts of solvent decrease the solids content and such compositions are useful for preparing thin films.

The solvent component C may comprise a mixture of two of more solvents. Solvent mixtures may be used to modify the viscosity and drying characteristics of the composition. Mixture of solvents are preferred and most preferred are mixtures of acetone, methyl acetate, methyl ethyl ketone, methyl isobutyl ketone, and dimethyl carbonate with other solvents wherein the mixture contains a total of 1-25% by weight of solvents other than acetone, methyl acetate, methyl ethyl ketone, methyl isobutyl ketone, and dimethyl carbonate.

The total amount of fluorinated compounds (D) that may be used is 0.01 to 10 weight percent of the sum of epoxy resin component A and cationic photoinitiator B, and where present optional epoxy resin F, optional reactive monomer G, and optional adhesion promoter I. It is more preferred to use 3-8 weight % of D and it is most preferred to use 3-5%.

The total amount of optional surfactant (E) that may be used is 0.001 to 5 weight percent of the sum of epoxy resin component A and cationic photoinitiator B, and where present optional epoxy resin F, optional reactive monomer G, and optional adhesion promoter I. It is more preferred to use 0.01-1 weight % of E and it is most preferred to use 0.05-0.5%.

When an optional epoxy resin F is used, the amount of resin F that may be used is 5-40 weight % of the total weight of components A and B, and where present, optional epoxy resin F, optional reactive monomer G, and optional adhesion promoter I and more preferably 10-30 weight % and most preferably 15-30 weight %.

When an optional reactive monomer G is used, the amount of G that may be used is 1-20 weight % of the total weight of components A and B, and where present, optional epoxy resin F, reactive monomer G, and adhesion promoter I and more preferably 2-15 weight % and most preferably 4-10 weight %.

When used, optional photosensitizer component H may be present in an amount that is 0.05-50 weight % relative to the photoinitiator component B and it is more preferred to use 0.5-50 weight % and most preferred to use 1-25 weight %.

When an optional adhesion promoter I is used, the amount of I that may be used is 0.1-3 weight % of the total weight of components A and B, and where present, optional epoxy resin F, reactive monomer G, and adhesion promoter I and more preferably 0.5-2.5 weight % and most preferably 1-2.5 weight %.

When an optional light absorbing compound J is used, the amount of J that may be used is 0.05-15 weight % of the weight of components A and more preferably 0.05-10 weight %.

Optionally, epoxy resins, epoxy acrylate and methacrylate resins, and acrylate and methacrylate homopolymers and copolymers other than components A and G can be used in the present invention. Phenol-novolac epoxy resins, trisphenolmethane epoxy resins, and the like are cited as examples of such alternate epoxy resins, and a methacrylate monomer such as pentaerythritol tetra-methacrylate and dipentaerythritol penta- and hexa-methacrylate, a methacrylate oligomer such as epoxymethacrylate, urethanemethacrylate, polyester polymethacrylate, and the like are cited as examples of methacrylate compounds. The amount used is preferably 0 to 50 weight % of the total weight of components A, B and F.

In addition, optional inorganic fillers such as barium sulfate, barium titanate, silicon oxide, amorphous silica, talc, clay, magnesium carbonate, calcium carbonate, aluminum oxide, aluminum hydroxide, montmorillonite clays, single-walled carbon nanotubes, multi-walled carbon nanotubes, graphene nanoparticles, and mica powder and various metal powders such as silver, aluminum, gold, iron, CuBiSr alloys, and the like can be used in the present invention. The content of inorganic filler may be 0.1 to 80 weight % of the composition. Likewise, organic fillers such as polymethylmethacrylate, rubber, fluoropolymers, crosslinked epoxies, polyurethane powders and the like can be similarly incorporated. When used, organic filler materials are not soluble in solvent component C.

When necessary, various materials such as crosslinking agents, thermoplastic resins, coloring agents, and thickening agents can be used in the present invention. Crosslinking agents can include, for example, methoxylated melamine, butoxylated melamine, and alkoxylated glycouril compounds. Cymel® 303 from Cytec Industries, Woodland Park, N.J., is a specific example of a suitable methoxylated melamine compound. Powderlink® 1174 from Cytec Industries, Woodland Park, N.J. is a specific example of an alkoxylated glycouril compound. Polyether sulfone, polystyrene, polycarbonate, and the like are cited as examples of thermoplastic resins; phthalocyanine blue, phthalocyanine green, iodine green, crystal violet, titanium oxide, carbon black, naphthalene black, and the like are cited as examples of coloring agents; asbestos, orben, bentonite, and montomorillonite are cited as examples of thickening agents. When these additives and the like are used, their general content in the composition of the present invention is 0.05 to 10 weight % each, but this can be increased or decreased as needed in accordance with the application objective.

The resin composition of the present invention can be prepared by combining components A through D and optional components E though J and when necessary, inorganic filler and other additives, preferably at the abovementioned ratios, mixing uniformly, dissolving, dispersing, and the like with a roll mill, paddle mixer, or similar devices known in the compounding art. It is particularly preferred that components A through J exclusive of solvent component C are diluted with solvent component C and adjusted to a viscosity appropriate to the intended use of the composition.

When using the photosensitive epoxy compositions of the present invention, the compositions may be applied to a low surface energy substrate using coating methods such as slot coating, doctor bar coating, roller coating, dip coating, gravure printing, screen printing, spin coating and the like. The drying bake conditions are chosen so as to form a film of photoresist and may comprise modifications to the carrier solvent (Component C), substrate temperature, exhaust velocity, formulation temperature, and related factors known to those skilled in the coatings art. The solid photoresist coating can then be photolihographically patterned or exposed using exposure tools providing actinic rays in the form of UV, e-beam, and x-ray radiation. It is preferred to use exposure tools providing 300-500 nm UV radiation from medium- or high-pressure mercury lamps or UV diodes through a photomask containing a pattern of opaque and transparent regions. Contact, proximity, or projection exposure modes may be used. Following exposure, a post-exposure-bake is carried out in order to accelerate the cationic polymerization reactions in the exposed regions of the coating. A relief image of the photomask in the coating is formed by a developing process wherein the coated substrate is immersed in an organic solvent developer in order to dissolve the non-polymerized regions of the coating. Typical immersion conditions are 2-5 minutes of contact with the developer solution with agitation at room ambient temperature. The contact time with the developer solvent will vary depending on the thickness of the coating, the solvent strength of the developer solvent, and the geometrical characteristics of the relief pattern. The developed image is rinsed by application of a rinse solvent to remove residual developer. Removal of the residual developer is necessary because the residual developer contains dissolved photoresist components that will form deposits in the relief image if the residual developer is allowed to dry on the substrate.

Optionally, the developer solvent may be applied by spraying using either an atomizing spray nozzle or fine shower-head type spray nozzle. Yet another method of developing the image comprises applying the developer using what is known in the photoresist art as a puddle process wherein the substrate to be developed is placed on a rotating tool head and then an amount of developer sufficient to form a standing layer or puddle on the entire substrate area is dispensed onto the substrate and allowed to stand for a defined period of time. After this time, the substrate is rotationally accelerated to spin off the spent developer and then decelerated until rotation stops. This sequence is repeated, if necessary, until a clear relief image is obtained and it is common to use a process wherein two to four solvent puddles are formed.

Suitable developer solvents include, but are not limited to, propylene glycol monomethyl ether acetate (PGMEA), gamma-butyrolactone, acetone, cyclopentanone, diacetone alcohol, tetrahydrofurfuryl alcohol, N-methylpyrrolidone, anisole, ethyl lactate, and the like. The developer solvents can be used singly or as mixtures. Propylene glycol methyl ether acetate is particularly preferred because of its good solvency for the unexposed photoresist components and relatively low cost.

Suitable rinse solvents include any of the developer solvents mentioned above as well as methanol, ethanol, isopropanol, and n-butyl acetate. It is preferred that the rinse solvents dry quickly and in this regard acetone, methanol, ethanol, and isopropanol are particularly preferred.

Optionally, a post-develop bake may be performed on the resulting image to more fully harden the material by driving the polymerization reaction to a higher degree of conversion.

Substrate materials that can be used for electrowetting device applications are hydrophobic polymers and fluoropolymers such as Teflon® AF (DuPont Company), Cytop® (Asahi Glass Company), and Fluoropel™ 1601 V (Cytonix Corp.) are particularly preferred. However, other substrates commonly encountered in semiconductor and MEMs fabrication can also be used and examples include, but are not limited to, silicon, silicon dioxide, silicon nitride, alumina, glass, glass-ceramics, gallium arsenide, indium phosphide, copper, aluminum, nickel, iron, steel, copper-silicon alloys, indium-tin oxide coated glass, organic films such as polyimide, polyester, and any substrate bearing patterned areas of metal, semiconductor, and insulating materials, and the like. Optionally, a bake step may be performed on the substrate to remove absorbed moisture prior to applying the photoresist coating.

When compositions according to the invention are applied directly to fluoropolymer layers, it is beneficial to avoid heating the fluoropolymer layer at temperatures above the glass transition temperature of the fluoropolymer prior to applying the photoresist composition.

The composition of the invention may also be applied using piezo-electric, thermal, or laser ink-jet printers. To use the compositions in a piezo-electric printer, the following steps are performed:

A piezo-electric printer cartridge, e.g., a Dimatix material cartridge model #DMC-11610, is filled by carefully inserting into the fill port the needle from a syringe filled with approximately 1.5 ml of the composition. The material is slowly injected, filling the fluid module. The pressure port of the fluid module and the opening of the jetting modules are aligned and snapped together. The filled cartridge is then allowed to stand at rest for 30 minutes to allow any entrapped air to settle away from the nozzles.

The proper waveform for the solution is selected, and the proper voltage settings for each print head are also selected to achieve the optimal drop velocity for the specific ink composition upon jetting.

The substrates for ink jet printing vary according to the required application, but can include typical semiconductor substrates such as silicon, gallium arsenide, other Group III-IV and Group III-V semiconductors, metals, glass, and ceramics. Flexible substrates can also be used and examples include various plastics such as PET, PETG, PEN, Kapton and Mylar. These substrates may be additionally coated with various metals such as gold, silver, and copper, or various metal oxide compounds such as indium-tin oxide, antimony tin oxide, and titanium dioxide.

Following ink jet deposition of the polymer compositions, the coatings may be cured by exposure to ultraviolet radiation (UV cure). Depending upon the composition and/or the evaporation rate of the solvent system in the composition, UV cured inks may require an additional thermal bake to fully cure the system after the initial exposure. High temperature (>120° C.) curing will also in some cases increase the rate of cure or chemical resistance of the coating.

In additional embodiments, relief patterns formed by ink jet printing using the compositions of the invention may be further subjected to a process known as photo trimming. This process involves exposing the ink jetted patterned substrate with UV light through a high resolution lithographic mask. The photo-trimming process may be used to improve pattern edge acuity for inkjet printed features and may also be used to selectively pattern high resolution features on substrates previously patterned by the inkjet process.

The compositions of the present invention may also be used as substrate bonding adhesives wherein a substrate coated with the composition is brought into contact with a second substrate such that, under suitable conditions of heat and pressure, an adhesive bond is formed between the two substrates. Depending upon the heat and pressure conditions used, this adhesive bond may be either temporary or permanent. In this use, a temporary adhesive bond is an adhesive bond that can be broken by treatment of the bonded substrates with a solvent while a permanent bond is an adhesive bond that is not weakened by solvent treatment.

Relief patterns may be formed in coated layers of the compositions by using imprinting methods. Imprinting is the process of transferring a pattern from a template to a substrate by physical contact. The compositions of the invention may be used in imprinting by coating the composition on a surface and then baking the wet coating to dry the film and provide an imprinting substrate. Next, a template bearing elevated features that may have either micron or submicron size features is brought into physical contact with the imprinting substrate. Pressure is then applied to the template, or to the imprinting substrate, or to both the template and imprinting substrate in a manner that causes the elevated features of the template to penetrate into the bulk of the permanent resist coating composition. The efficacy of the imprinting process may be aided by applying heat to the imprinting substrate to soften the permanent resist coating. The template is then separated from the imprinting substrate to provide a patterned substrate wherein the elevated features of template become recessed images in the permanent photoresist coating. This process is described as microimprinting when the feature size is in the micron range and nanoimprinting when the feature size is less than a micron. The transferred pattern may be fixed into the substrate film by exposing the pattern to UV radiation to initiate cationic polymerization of the photoresist composition and then performing a subsequent bake step to complete polymerization and cross linking of the film. Alternatively and without the use of ultraviolet or other active rays, either before or after separation of the template from the imprinted substrate, the patterned substrate may be heated to a temperature sufficient to activate PAG decomposition and subsequent cationic polymerization and thereby provide the permanent photoresist layer. It is possible to combine the processes of image wise, ultraviolet lithography as described above with image wise imprinting lithography to provide a patterned permanent photoresist coating on a substrate in which some portion of the relief pattern is formed by the photolithographic process and some portion by the imprinting process.

The photoresist compositions of the present invention can be used to manufacture dry film photoresists. To prepare a dry film photoresist, a photoresist composition according to the present invention is applied to a base film material using coating methods such as roller coating, doctor bar coating, slot coating, dip coating, spin coating, gravure coating, and the like. The coated base film is then dried in a drying oven set at 60 to 160° C. for a time sufficient to remove the desired amount of solvent. A cover film is then applied to the photoresist side of the coated film to protect the film from damage and to prevent sheets of coated material from sticking together. The thickness of the photoresist on the base film may be adjusted to about 1 to about 100 μm by suitable selection of solvents, photoresist solids content and coating parameters. Organic polymer film materials such as polyethylene terephthalate, polypropylene, and polyimide can be used as the base film. and organic polymers such as polyethylene, polypropylene, and polyethylene terephthalate can be used as the cover sheet material.

The dry film photoresist is used by first peeling the protective cover sheet from the photoresist layer, placing the dry film on a substrate with the photoresist side in contact with the substrate, laminating the photoresist to the substrate by application of heat and pressure using a lamination device and then peeling the base film from the photoresist. These operations result in forming a photoresist layer on the substrate which may be subsequently processed image-wise using the methods described herein.

The photoresist compositions according to the invention have excellent imaging characteristics and the cured products have excellent chemical resistance to solvents, alkalis, and acids and show good thermal stability and electrical properties.

EXAMPLES

The present invention is further described in detail by means of the following Examples and Comparisons. All parts and percentages are by weight and all temperatures are degrees Celsius unless explicitly stated otherwise.

General Experimental Procedures for Preparation and Testing of Formulated Compositions General Formulation Method for Composition Examples 1 through 21 and Comparative Examples 1 and 2

All compositions according to the invention were prepared by individually weighing the components of the compositions into 4 ounce, wide-mouth amber glass bottles. The bottle was tightly capped and then rolled on a roller mill for 4-8 hours until all components were completely dissolved. The samples were allowed to equilibrate to room temperature and were evaluated without further manipulation.

The chemical or trade names, sources, functions, and component type of the substances used to prepare the compositions according to the invention are listed in Table 1.

Method for Preparing Fluoropolymer Substrates

Teflon® AF coated fluoropolymer substrates were prepared by spin coating Teflon AF 1600 solution (DuPont Company) on <100> silicon wafers and then baking the wet coating at 135° C. for 30 seconds on a hotplate. The resulting coatings had a thickness of 0.5 μm and a water contact angle of 120-125° (sessile drop method).

Cytop® coated fluoropolymer substrates were prepared by spin coating Cytop CTX-809SP2 solution (Asahi Glass Company) on <100> silicon wafers and then baking the wet coating at 90° C. on a hot plate for either 60 seconds or 180 seconds. The resulting coatings had a thickness of 1.3 μm and a water contact angle of 116° (sessile drop method).

Method and Scale for Adhesion Evaluation

The adhesion of lithographic patterns made using the compositions of the invention was evaluated using a numeric ranking scale as follows:

| Adhesion Scale Rank Value | Description of Adhesion Behavior |
|---|---|
| 1 | Substantially all of the patterned features fall of the coated substrate during processing. |
| 2 | A small portion of the patterned features adhere to substrate but most fall off during processing. |
| 3 | Small pattern features fall off during processing, large features retained, stress and coating defect related adhesion failures may occur. |
| 4 | Patterns intact but stress and coating defect related adhesion failures may occur. |
| 5 | Patterns intact with no stress or coating defect related adhesion failures observed. |

Method for Measuring Contact Angles

Sessile drop contact angle measurements were performed using a Biolin Scientific Attension Theta goniometer. Water was used as the measurement fluid. A drop size of 5 μL dispensed at a rate of 5 μL/s was used. Four drops were dispensed across the test substrate and 10 measurements were performed on each drop at 1 second intervals. The measurements for each drop were averaged and then the average of all drops was calculated and reported as the result.

Method for Measuring Film Thickness

Film thickness measurements were performed using either a FilmTek optical film thickness gauge or by calibrated line measurements using a scanning electron microscope.

TABLE 1

List of Material Identities, Material Sources, Material Functions, and Component Type.

| Material | Supplier | Function | Formulation Component Type |
|---|---|---|---|
| SU-8 Epoxy Resin | Momentive Specialty Chemicals | Film Forming Resin | A (Formula 1) |
| Bisphenol A Novolac Epoxy Resin | Nippon Kayaku. | Film Forming Resin | A (Formula 1) |
| NC-3000 Epoxy Resin | Nippon Kayaku | Film Forming Resin | A (Formula II) |
| NC-3000H Epoxy Resin | Nippon Kayaku | Film Forming Resin | A (Formula II) |
| NER-7604 Epoxy Resin | Nippon Kayaku | Film Forming Resin | A (Formula III) |
| NC-6300H Epoxy Resin | Nippon Kayaku | Film Forming Resin | A (Formula VI) |
| EHPE-3150 Epoxy Resin | Daicel | Film Forming Resin | A (Formula V-$E_1$) |
| EX 2177 Epoxy Resin | Epoxonics, GmbH | Film Forming Resin | A (Formula III) |
| Cyracure 6976 (Mixed aryl sulfonium $SbF_6$ salts, 50% solution in propylene carbonate solvent) | Dow Chemical Company | PAG | B |
| Octyloxyphenylphenyl iodonium hexafluoroantimonate | Hampford Research | PAG | B |
| Irgacure 290 | BASF | PAG | B |
| Acetone | Brenntag | Solvent | C |
| Propylene carbonate | Sigma-Aldrich | Solvent | C |
| Cyclopentanone | Rhodia | Solvent | C |
| Ethyl Acetate | Sigma-Aldrich | Solvent | C |
| Methyl Acetate | Sigma-Aldrich | Solvent | C |
| Dimethyl carbonate | Sigma-Aldrich | Solvent | C |
| 2,3-Dihydroperfluoropentane | Dupont | Fluorinated Compound | D |
| Novec ® HFE-7200 | 3M Company | Fluorinated Compound | D |
| Novec ® HFE-7300 | 3M Company | Fluorinated Compound | D |
| PF 7002 | Omnova | Surfactant | E |
| Baysilone 3739 | OMG | Surfactant | E |
| ED 506 (polypropylene glycol diglycidyl ether) | Asahi-Denka | Reactive Monomer | G |
| OXT 221 | Toa Gosei Co. LTD. | Reactive Monomer | G |
| Darocur ITX | Ciba Specialty Chemicsls | Photosensitizer | H |
| AN910E | Spectra Group Ltd | Photosensitizer | H |
| 3-glycidoxypropyl trimethoxysilane | Dow Corning | Adhesion Promoter | I |
| 4,4'[oxybis(p-phenoleneazo)] diphenol | MicroChem Corp. | Dye | F |

Example 1

A photosensitive epoxy composition containing 61.54% BNER (Component A), 0.462% Irgacure 290 (Component B), 36.10% acetone (Component C), 0.57% propylene carbonate (Component C), 1.33% DPF (Component D) and 0.0615% PF 7002 (Component E) was prepared according to the General Formulation Method.

The composition was coated on a Teflon® AF 1600 fluoropolymer substrate (prepared using the General Method for Preparing Fluoropolymer Substrates) using a motor driven doctor blade apparatus at a coating bar speed of about 20 mm/sec. The wet coating was allowed to stand for 15 minutes and was then dried by baking the coated substrate in a convection oven at 65° C. for 3 minutes followed by cooling to room temperature over a period of 15 minutes. The composition film thickness was 7-8 microns. The film was exposed through a pixel wall pattern mask using 365 nm radiation at a dose of 80 mJ/cm². The exposed substrate was post-exposure baked at 135° C. for 3 minutes in a convection oven. The latent relief image was developed by immersing the substrate in PGMEA solvent at room ambient temperature for 2 minutes followed by rinsing with a stream of fresh PGMEA solvent followed by final drying under a gentle stream of flowing air for about 1 minute. Processing was completed by baking the patterned substrates at 175° C. for 5 minutes on a hot plate.

Figure 2A:
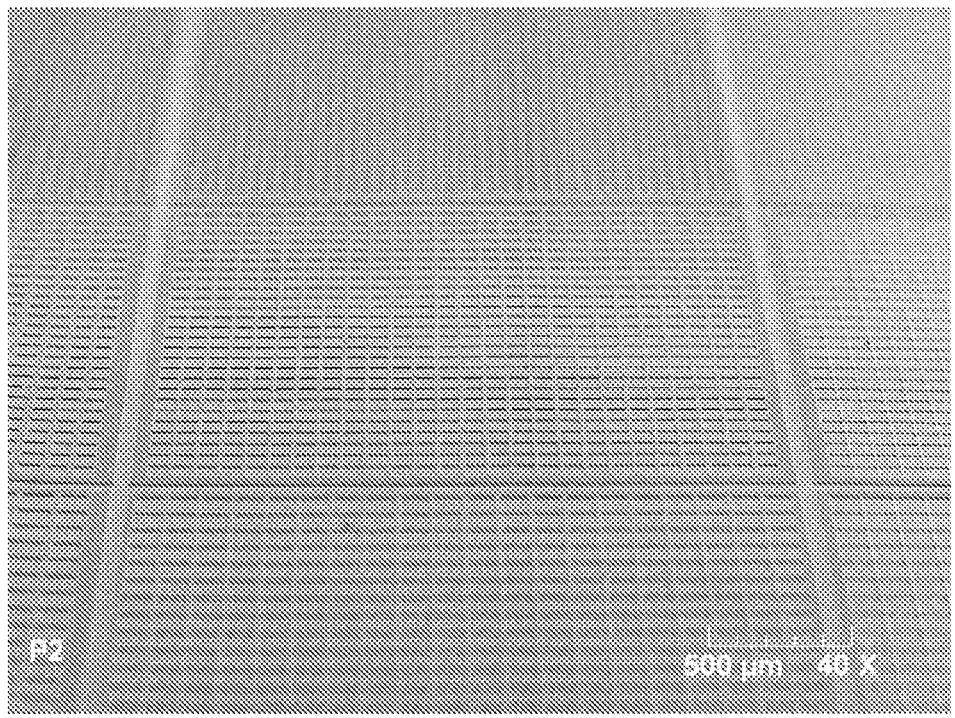
FIG. 2a shows a SEM image of a pixel wall pattern formed on a Teflon® AF surface using a composition and process for using the composition according to the invention.
Figure 2B:
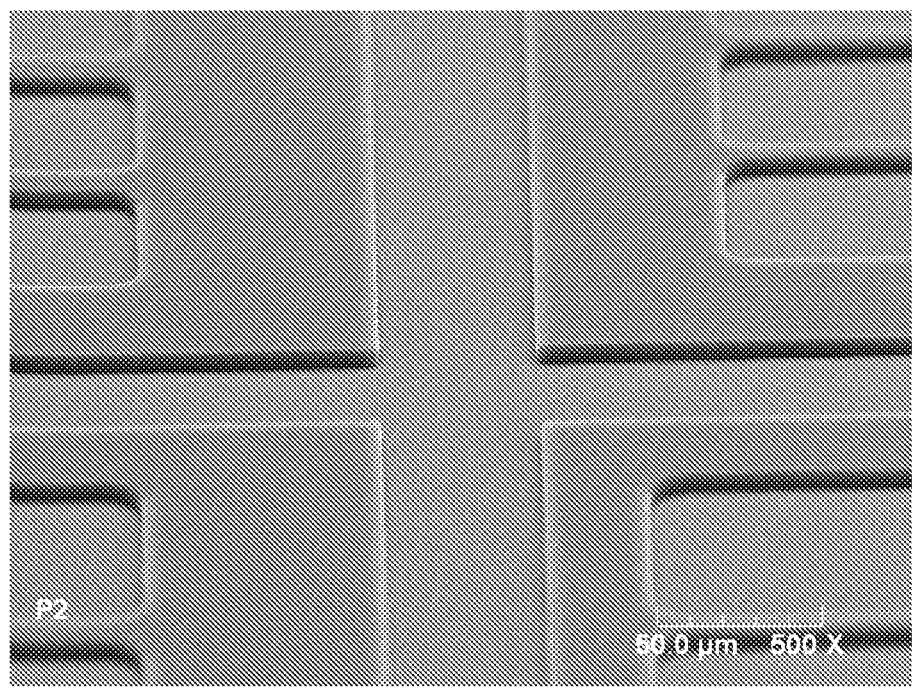

The developed patterns showed excellent lithographic definition with an adhesion scale rank value of 5 as demonstrated in the scanning electron micrograph images shown in FIG. 2a and FIG. 2b. The sessile drop water contact angle of the fluoropolymer surface after completion of the patterning process was 122° demonstrating that the wetting characteristic of the fluoropolymer surface was not altered by the process regime used to pattern the composition.

Example 2

A photosensitive epoxy composition containing 60.40% SU-8 (Component A), 3.02% Cyracure 6976 (Component B), 32.53% acetone (Component C), 3.02% propylene carbonate (Component C), 1.01% DPF (Component D) and 0.030% PF 7002 (Component E) was prepared according to the General Formulation Method.

The composition was processed on a Teflon® AF coated substrate using the processing conditions described in Example 1 with the exceptions that the exposure dose was 100 mJ/cm² and the post exposure bake was performed at 95° C. for 15 minutes in a convection oven. The resulting relief pattern showed excellent lithographic definition with an adhesion scale rank value of 5. The sessile drop water contact angle of the fluoropolymer surface after completion of the patterning process was 122° demonstrating that the wetting characteristic of the fluoropolymer surface was not altered by the process regime used to pattern the composition.

Example 3

A photosensitive epoxy composition containing 59.8% BNER (Component A), 2.09% OPPI (Component B), 35.52% acetone (Component C), 0.57% propylene carbonate (Component C), 1.65% DPF (Component D), 0.060% PF 7002 (Component E) and 0.31% AN910E (Component H) was prepared according to the General Formulation Method.

The composition was processed on a Teflon® AF coated substrate using the processing conditions described in Example 1 with the exception that the exposure dose was 150 mJ/cm$^2$. The resulting relief pattern showed excellent lithographic definition with an adhesion scale rank value of 5. The sessile drop water contact angle of the fluoropolymer surface after completion of the patterning process was 121° demonstrating that the wetting characteristic of the fluoropolymer surface was not altered by the process regime used to pattern the composition.

Example 4

A photosensitive epoxy composition containing 30.63% BNER (Component A), 13.50% N7604 (Component A), 13.50% E3150 (Component A), 0.61% Irgacure 290 (Component B), 35.84% acetone (Component C), 0.57% propylene carbonate (Component C), 1.33% DPF (Component D), 0.0615% PF 7002 (Component E), 2.46% ED506 (Component G) and 1.23% Z6040 (Component I) was prepared according to the General Formulation Method.

The composition was processed on a Teflon® AF coated substrate using the processing conditions described in Example 1 with the exceptions that the wet coating bake conditions were 75° C. for 3 minutes in a convection oven, the exposure dose was 100 mJ/cm$^2$, and the post exposure bake conditions were 135° C. for 4 minutes in a convection oven. The resulting relief pattern showed excellent lithographic definition with an adhesion scale rank value of 5. The sessile drop water contact angle of the fluoropolymer surface after completion of the patterning process was 123° demonstrating that the wetting characteristic of the fluoropolymer surface was not altered by the process regime used to pattern the composition.

Example 5

A photosensitive epoxy composition containing 64.47% BNER (Component A), 1.10% Irgacure 290 (Component B), 33.35% acetone (Component C), 1.05% DPF (Component D) and 0.030% PF 7002 (Component E) was prepared according to the General Formulation Method.

The composition was processed on a Teflon® AF coated substrate using the processing conditions described in Example 1 with the exceptions that the wet coating bake conditions were 65° C. for 30 minutes in a convection oven, the exposure dose was 150 mJ/cm$^2$, and the post exposure bake conditions were 65° C. for 30 minutes in a convection oven. The resulting relief pattern showed excellent lithographic definition with an adhesion scale rank value of 5. The sessile drop water contact angle of the fluoropolymer surface after completion of the patterning process was 122° demonstrating that the wetting characteristic of the fluoropolymer surface was not altered by the process regime used to pattern the composition.

Example 6

The composition of Example 1 was processed on a Cytop coated substrate using the processing conditions described in Example 1 with the exceptions that the wet coating bake conditions were 65° C. for 4 minutes and the exposure dose was 100 mJ/cm$^2$. The resulting relief pattern showed excellent lithographic definition with an adhesion scale rank value of 5. The sessile drop water contact angle of the fluoropolymer surface after completion of the patterning process was 116° demonstrating that the wetting characteristic of the fluoropolymer surface was not significantly altered by the process regime used to pattern the composition.

Example 7

A photosensitive epoxy formulation containing 60.0% SU-8 (Component A), 3.0% Cyracure 6976 (Component B), 32.5% methyl acetate (Component C), 3.0% propylene carbonate (Component C), 1.5% Novec 7200 (Component D) was prepared according to the General Formulation Method.

The composition was processed on a Teflon® AF coated substrate using the processing conditions described in Example 1 with the exceptions that the wet coating was allowed to stand at room ambient conditions for 10 minutes and was then dried in a convection oven at 75° C. for 4 minutes to form a dried film 7-8 microns thick and the dried film was exposed at a dose of 200 mJ/cm$^2$. The resulting film showed excellent lithographic definition with an adhesion scale rank of 5. The sessile drop water contact angle of the fluoropolymer surface after completion of the patterning process was 123.1° demonstrating that the wetting characteristic of the fluoropolymer surface was not altered by the process regime used to pattern the composition.

Example 8

A photosensitive epoxy formulation containing 60.0% SU-8 (Component A), 3.0% Cyracure 6976 (Component B), 32.5% methyl acetate (Component C), 3.0% propylene carbonate (Component C), and 1.5% Novec 7300 (Component D) was prepared according to the General Formulation Method.

The composition was processed on a Teflon® AF coated substrate using the processing conditions described in Example 1 with the exceptions that the wet coating was allowed to stand at room ambient conditions for 10 minutes and was then dried in a convection oven at 75° C. for 4 minutes to form a dried film 7-8 microns thick and the dried film was exposed at a dose of 200 mJ/cm$^2$. The resulting film showed excellent lithographic definition with an adhesion scale rank of 5. The sessile drop water contact angle of the fluoropolymer surface after completion of the patterning process was 123.4° demonstrating that the wetting characteristic of the fluoropolymer surface was not altered by the process regime used to pattern the composition.

Example 9

A photosensitive epoxy formulation containing 60.0% SU-8 (Component A), 3.0% Cyracure 6976 (Component B), 32.5% methyl acetate (Component C), 3.0% propylene carbonate (Component C), 0.75% Novec 7200 (Component D) and 0.75% Novec 7300 (Component D) was prepared according to the General Formulation Method.

The composition was processed on a Teflon® AF coated substrate using the processing conditions described in Example 1 with the exceptions that the wet coating was allowed to stand at room ambient conditions for 10 minutes and was then dried in a convection oven at 75° C. for 4 minutes to form a dried film 7-8 microns thick and the dried film was exposed at a dose of 200 mJ/cm². The resulting film showed excellent lithographic definition with an adhesion scale rank of 5. The sessile drop water contact angle of the fluoropolymer surface after completion of the patterning process was 124.1° demonstrating that the wetting characteristic of the fluoropolymer surface was not altered by the process regime used to pattern the composition.

Example 10

A photosensitive epoxy composition containing 61.90% BNER (Component A), 3.09% Cyracure 6976 (Component B), 30.51% methyl acetate (Component C), 3.09% propylene carbonate (Component C), and 1.41% DPF (Component D) was prepared according to the General Formulation Method.

The composition was processed on a Teflon® AF coated substrate using the processing conditions described in Example 1 with the exceptions that the wet coating was dried in a convection oven at 65° C. for 4 minutes and the exposure dose was 200 mJ/cm². The resulting relief pattern showed excellent lithographic definition with an adhesion scale rank value of 5. The sessile drop water contact angle of the fluoropolymer surface after completion of the patterning process was 122.7° demonstrating that the wetting characteristic of the fluoropolymer surface was not altered by the process regime used to pattern the composition.

Example 11

A photosensitive epoxy composition containing 66.66% BNER (Component A), 3.33% Cyracure 6976 (Component B), 25.47% ethyl acetate (Component C), 3.33% propylene carbonate (Component C), and 1.19% DPF (Component D) was prepared according to the General Formulation Method.

The composition was processed on a Teflon® AF coated substrate using the processing conditions described in Example 1 with the exceptions that wet coating was dried at 80° C. for 4 minutes in a convection oven and the exposure dose was 200 mJ/cm². The resulting relief pattern showed excellent lithographic definition with an adhesion scale rank value of 4.

Example 12

A photosensitive epoxy composition containing 66.66% BNER (Component A), 3.33% Cyracure 6976 (Component B), 25.47% dimethyl carbonate (Component C), 3.33% propylene carbonate (Component C), and 1.19% DPF (Component D) was prepared according to the General Formulation Method.

The composition was processed on a Teflon® AF coated substrate using the processing conditions described in Example 1 with the exceptions that wet coating was dried at 80° C. for 4 minutes in a convection oven and the exposure dose was 200 mJ/cm². The resulting relief pattern showed excellent lithographic definition with an adhesion scale rank value of 4.

Example 13

A photosensitive epoxy composition containing 57.15% NC6300H (Component A), 2.86%% Cyracure 6976 (Component B), 35.72% methyl acetate (Component C), 2.86% propylene carbonate (Component C), 1.40% Novec HFC-7200 (Component D), and 0.01% PF 6320 (Component E) was prepared according to the General Formulation Method.

The composition was processed on a Teflon® AF coated substrate using the processing conditions described in Example 1 with the exceptions that wet coating was dried at 70° C. for 1.5 minutes on a hot plate, the exposure dose was 175 mJ/cm², and the developed pattern was baked at 200° C. for 10 minutes on a hot plate. The resulting relief pattern showed excellent lithographic definition with an adhesion scale rank value of 5. The sessile drop water contact angle of the fluoropolymer surface was 122.7° prior to coating the composition and was 122.7° after completion of the processing.

Example 14

The composition of Example 1 was processed on a glass substrate coated with Teflon AF 1600 using the processing conditions described in Example 1 with the exception that the exposure dose was 200 mJ/cm². The resulting relief pattern showed excellent lithographic definition with an adhesion scale rank of 3-4. The sessile drop water contact angle of the fluoropolymer surface was 122.9° prior to coating the composition and was 122.4° after completion of the processing. This result shows that adhesion performance is not affected by the nature of the fluoropolymer coated substrate (glass vs. silicon) or the exposure dose used to print patterns.

Example 15

A photosensitive epoxy composition containing 30.71% BNER (Component A), 13.54% N7604 (Component A), 13.54% NC-3000H (Component A), 0.61% Irgacure 290 (Component B), 35.94% acetone (Component C), 0.57% propylene carbonate (Component C), 1.33% Novec 7200 (Component D), 0.061% PF 7002 (Component E), 2.47% ED506 (Component G) and 1.23% Z6040 (Component I) was prepared according to the General Formulation Method.

The composition was processed on a Teflon® AF coated substrate using the processing conditions described in Example 1 with the exceptions that the wet coating was allowed to stand for 5 minutes, was dried at 75° C. for 5 minutes on a hot plate, the dried coating was exposed at 150 mJ/cm², and the post exposure bake conditions were 135° C. for 30 seconds. The resulting relief pattern showed excellent lithographic definition with an adhesion scale rank value of 5. The sessile drop water contact angle of the fluoropolymer surface after completion of the patterning process was 123° demonstrating that the wetting characteristic of the fluoropolymer surface was not altered by the process regime used to pattern the composition.

Example 16

A photosensitive epoxy formulation containing 57.14% SU-8 (Component A), 2.86% Cyracure 6976 (Component B), 35.73% methyl acetate (Component C), 2.86% propylene carbonate (Component C), and 1.41% Novec 7200 (Component D) was prepared according to the General Formulation Method.

The composition was processed on a Teflon® AF coated substrate using the processing conditions described in Example 1 with the exceptions that: prior to coating the photosensitive epoxy formulation, the Teflon AF coating was baked at 175° C. for 60 seconds; the wet the photosensitive epoxy coating was allowed to stand at room ambient conditions for 5 minutes and was then dried at 75° C. for 4 minutes on a hot plate to form a dried film 7-8 microns thick, the dried film was exposed at a dose of 150 mJ/cm², and the post exposure bake was performed at 135° C. for 30 seconds on a hot plate. The resulting film showed excellent lithographic definition with an adhesion scale rank of 4.5. The sessile drop water contact angle of the fluoropolymer surface after completion of the patterning process was 123.1° demonstrating that useful adhesion of the epoxy coating to the fluoropolymer is obtained when the fluoropolymer is processed at a temperature x degrees above the fluoropolymer glass transition temperature of about 150-160° C.

Example 17

A photosensitive epoxy formulation containing 57.14% SU-8 (Component A), 2.86% Cyracure 6976 (Component B), 35.73% methyl acetate (Component C), 2.86% propylene carbonate (Component C), 1.41% Novec 7200 (Component D) was prepared according to the General Formulation Method.

The composition was processed on a Teflon® AF coated substrate using the processing conditions described in Example 1 with the exceptions that; the wet the photosensitive epoxy coating was allowed to stand at room ambient conditions for 5 minutes and was then dried at 75° C. for 4 minutes on a hot plate to form a dried film 7-8 microns thick, the dried film was exposed at a dose of 150 mJ/cm², and the post exposure bake was performed at 135° C. for 30 seconds on a hot plate. The resulting film showed excellent lithographic definition with an adhesion scale rank of 5. The sessile drop water contact angle of the fluoropolymer surface after completion of the patterning process was 123.88° demonstrating, in comparison with Example 16, that improved adhesion of the epoxy coating to the fluoropolymer is obtained when the fluoropolymer is processed at a temperature below the fluoropolymer glass transition temperature of about 150-160° C.

Example 18

A photosensitive epoxy composition containing 30.71% BNER (Component A), 13.54% $N_{7604}$ (Component A), 13.54% NC-300H (Component A), 0.61% Irgacure 290 (Component B), 35.94% acetone (Component C), 0.57% propylene carbonate (Component C), 1.33% Novec 7200 (Component D), 0.06% PF 7002 (Component E), 2.47% OXT 221 (Component G) and 1.23% Z6040 (Component I) was prepared according to the General Formulation Method.

The composition was processed on a Teflon® AF coated substrate using the processing conditions described in Example 1 with the exceptions that the wet coating standing time was 5 minutes, the wet coating bake conditions were 75° C. for 5 minutes on a hot plate, the exposure dose was 150 mJ/cm², and the post exposure bake conditions were 135° C. for 30 seconds on a hot plate. The resulting relief pattern showed excellent lithographic definition with an adhesion scale rank value of 5. The sessile drop water contact angle of the fluoropolymer surface after completion of the patterning process was 124.4° demonstrating that the wetting characteristic of the fluoropolymer surface was not altered by the process regime used to pattern the composition.

Example 19

A photosensitive epoxy formulation containing 57.01% SU-8 (Component A), 2.85% Cyracure 6976 (Component B), 35.86% methyl acetate (Component C), 2.85% propylene carbonate (Component C), 1.14% Novec 7200 (Component D), and 0.285% Darocur ITX (Component H) was prepared according to the General Formulation Method.

The composition was processed on a Teflon® AF coated substrate using the processing conditions described in Example 1 with the exceptions that the wet coating standing time was 5 minutes, the wet coating bake conditions were 75° C. for 5 minutes on a hot plate, the exposure dose was 80 mJ/cm², and the post exposure bake conditions were 135° C. for 30 seconds. The resulting relief pattern showed excellent lithographic definition with an adhesion scale rank value of 5. The sessile drop water contact angle of the fluoropolymer surface after completion of the patterning process was 124.1°demonstrating that the wetting characteristic of the fluoropolymer surface was not altered by the process regime used to pattern the composition.

Example 20

A photosensitive epoxy composition containing 57.13% SU-8 (Component A), 2.86% Cyracure 6976 (Component B), 35.93% methyl acetate (Component C), 2.86% propylene carbonate (Component C), and 1.14% Novec 7200 (Component D) and 0.095% 4,4'[oxybis(p-phenoleneazo)] diphenol (Component H) was prepared according to the General Formulation Method.

The composition was processed on a Teflon® AF coated substrate using the processing conditions described in Example 1 with the exceptions that the wet coating standing time was 5 minutes, the wet coating bake conditions were 75° C. for 4 minutes on a hot plate, the exposure dose was 400 mJ/cm², and the post exposure bake conditions were 135° C. for 30 seconds. The resulting relief pattern showed excellent lithographic definition with an adhesion scale rank value of 4.5. The sessile drop water contact angle of the fluoropolymer surface after completion of the patterning process was 123.4° demonstrating that the wetting characteristic of the fluoropolymer surface was not altered by the process regime used to pattern the composition.

Example 21

A photosensitive epoxy composition containing 57.00% EX2177 (Component A), 2.85% Cyracure 6976 (Component B), 35.92% methyl acetate (Component C), 2.85% propylene carbonate (Component C), and 1.38% Novec 7200 (Component D) was prepared according to the General Formulation Method.

The composition was processed on a Teflon® AF coated substrate using the processing conditions described in Example 1 with the exceptions that the wet coating standing time was 5 minutes, the wet coating bake conditions were 75° C. for 4 minutes on a hot plate, the exposure dose was 300 mJ/cm², and the post exposure bake conditions were 135° C. for 30 seconds. The resulting relief pattern showed excellent lithographic definition with an adhesion scale rank value of 4.5. The sessile drop water contact angle of the fluoropolymer surface after completion of the patterning process was 123.8° demonstrating that the wetting characteristic of the fluoropolymer surface was not altered by the process regime used to pattern the composition.

Comparative Example 1

A photosensitive epoxy composition containing 61.5% BNER (Component A), 0.462% Irgacure 290 (Component B), 37.36% acetone (Component C), 0.57% propylene carbonate (Component C), and 0.06% PF 7002 (Component E) was prepared according to the General Formulation Method.

Figure 3A:
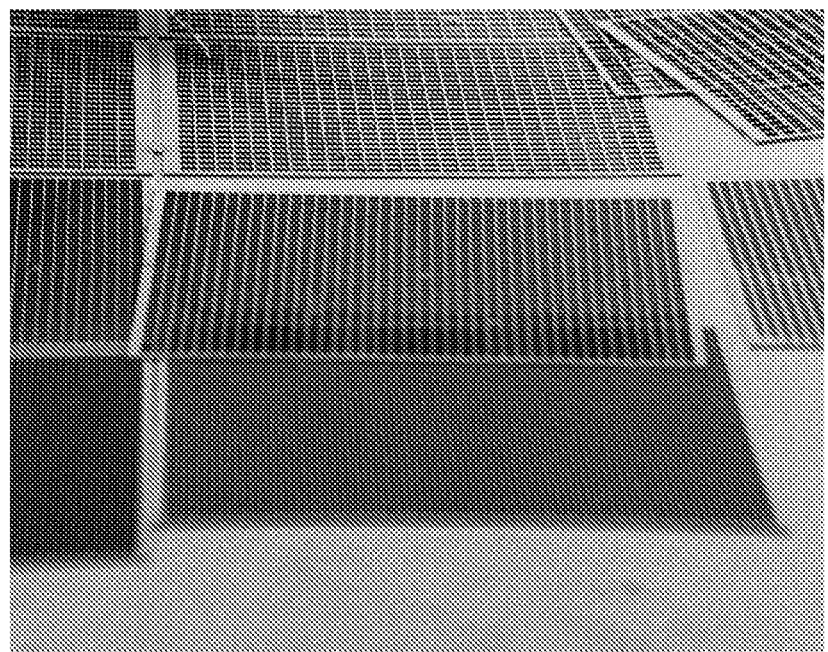
FIG. 3a shows a SEM image of a pixel wall pattern formed on a Teflon® AF surface using a comparative composition wherein major adhesion loss of the composition to the Teflon AF surface has occurred.
Figure 3B:
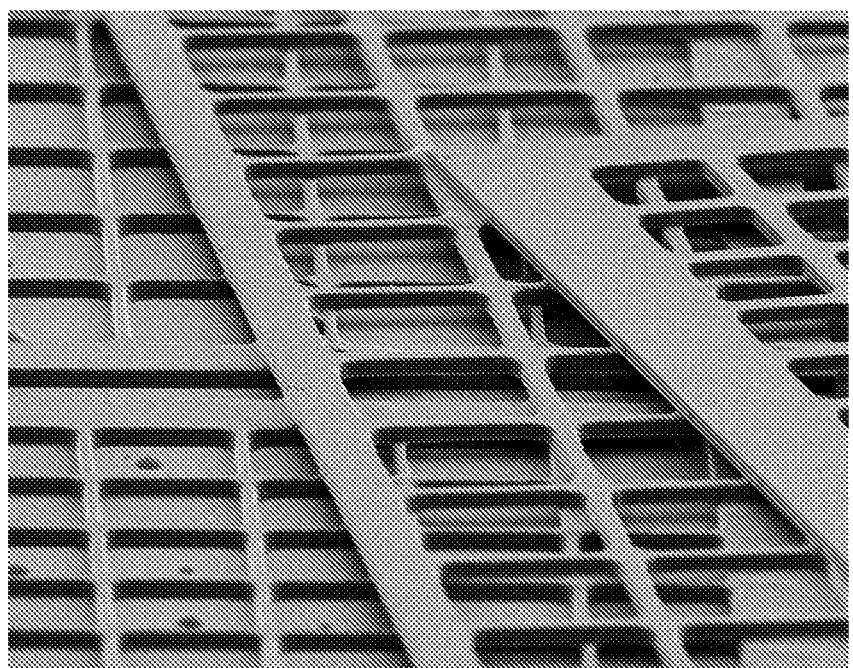

The composition was processed on a Teflon® AF coated substrate using the processing conditions described in Example 1. The resulting relief pattern showed good lithographic definition but had an adhesion rank value of 1 showing poor adhesion which is further illustrated in the SEM images shown in FIG. 3a and FIG. 3b. The sessile drop water contact angle of the fluoropolymer surface after completion of the patterning process was 122° demonstrating that the wetting characteristic of the fluoropolymer surface was not altered by the process regime used to pattern the composition. These comparisons demonstrate the necessity of including fluorinated compound Component D in the composition to obtain good adhesion according to the invention.

Comparative Example 2

A photosensitive epoxy composition containing 42.78% SU-8 (Component A), 2.14% Cyracure 6976 (Component B), 52.86% cyclopentanone (Component C), 2.14% propylene carbonate (Component C), and 0.08% Baysilone 3739 (Component E), was slot coated on a Teflon AF coated silicon wafer prepared using the according to the procedure described in Method for Preparing Fluoropolymer Substrates. The composition failed to form a uniform coating and severe non wetting behavior was observed.

What is claimed is:

1. A layer of permanent epoxy photoresist composition useful for making negative-tone, permanent photoresist relief patterns on low surface energy polymer substrates, comprising:

(A) one or more epoxy resins selected from the group consisting of one or more epoxy resins according to Formula I through Formula VI:

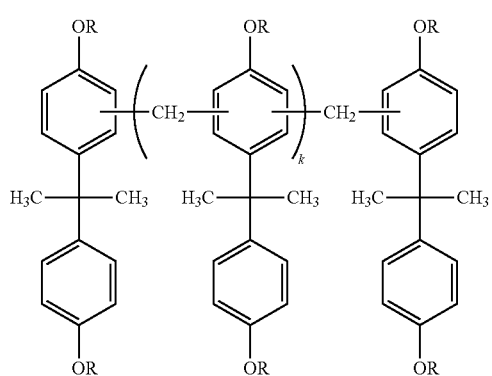

wherein each group R in Formula I is individually selected from glycidyl or hydrogen and k in Formula I is a real number ranging from 0 to about 30;

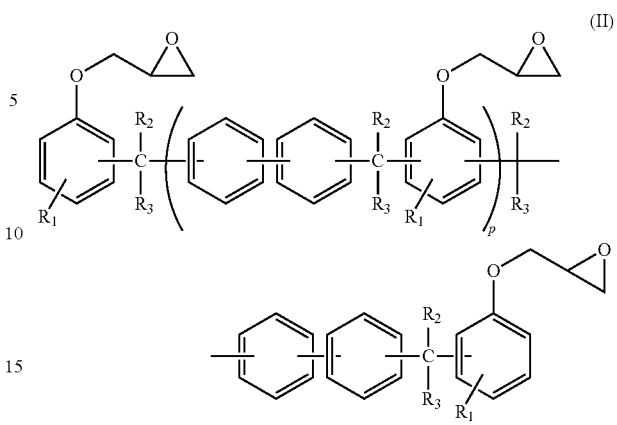

wherein each $R_1$, $R_2$ and $R_3$ in Formula II are independently selected from the group consisting of hydrogen or alkyl groups having 1 to 4 carbon atoms and the value of p in Formula II is a real number ranging from 1 to about 30;

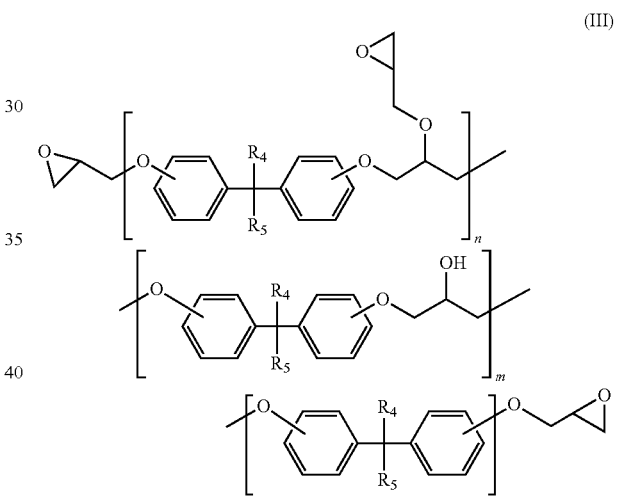

wherein each $R_4$ and $R_5$ in Formula III are independently selected for the group consisting of hydrogen, alkyl groups having 1 to 4 carbon atoms, or trifluoromethyl groups and the values of n and m in Formula III are independently real numbers ranging from 1 to about 30;

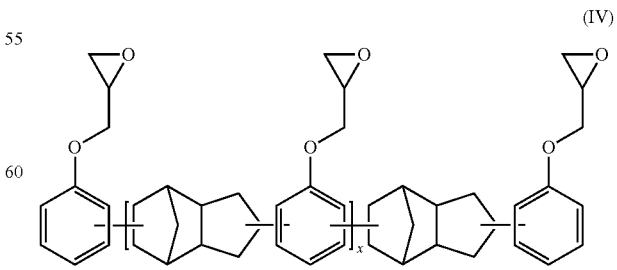

wherein x in Formula IV is a real number ranging from 1 to about 30;

(V)

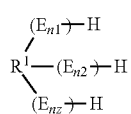

(E1)

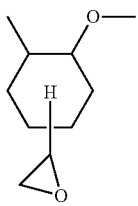

(E2)

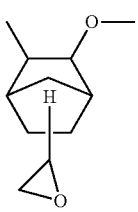

wherein $R_1$ in Formula V represents a residue of an organic compound having z active hydrogen atoms, $n_1$ through $n_z$ each represents 0 or an integer from 1 to 100, the sum of the integers represented by $n_1$ through $n_z$ is from 1 to 100, z represents an integer from 1 to 100 and E represents separately either groups E1 or E2; and (VI)

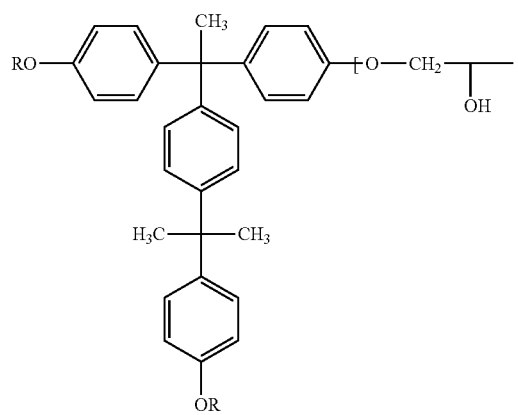

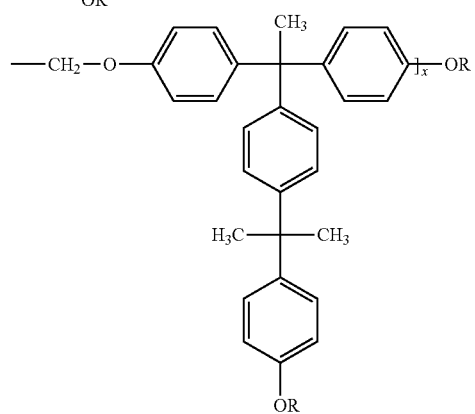

wherein each group R in Formula VI is individually selected from glycidyl or hydrogen and x in Formula VI is a real number ranging from 0 to about 30;

(B) one or more cationic photoinitiators;

(C) one or more film casting solvents selected from the group consisting of methyl acetate, ethyl acetate, acetone, methyl ethyl ketone, methyl isobutyl ketone, dimethyl carbonate and combinations thereof; and (D) one or more fluorinated compounds selected from the group consisting of 2,3-dihydroperfluoropentane, ethoxy-nonafluorobutane, 1,1,1,2,2,3,4,5,5,5-decafluoro-3-methoxy-4-(trifluoromethyl)-pentane, and combinations thereof;

wherein said fluorinated compounds (D) are present in said composition in an amount ranging from 0.75 wt % to 1.65 wt % based on the total weight of the composition and wherein said composition is applied onto a low surface energy polymer substrate to make a negative-tone, permanent photoresist layer.

2. The layer of claim 1, further comprising one or more of the following additive materials:
    (E) one or more surfactants,
    (F) one or more optional epoxy resins;
    (G) one or more reactive monomers;
    (H) one or more photosensitizers;
    (I) one or more adhesion promoters; and
    (J) one or more light absorbing compounds including dyes and pigments.

3. The layer of claim 1, further comprising one or more additional materials selected from the group consisting of thermal acid generator compounds, flow control agents, thermoplastic and thermosetting organic or organometallic polymers and resins, inorganic filler materials, and radical photoinitiators.

4. The layer of claim 1, wherein one or more of the epoxy resins (A) is a bisphenol A novolac epoxy resin.

5. A method of forming a permanent photoresist relief pattern on a low surface energy polymer substrate comprising the steps of: (1) providing a low surface energy polymer layer on a substrate by coating a low surface energy polymer solution on the substrate; (2) forming a layer of the photoresist composition of claim 1 on the low surface energy polymer substrate; (3) evaporating most of the solvent from the photoresist layer by heating the coated substrate to form a film of the photoresist composition on the substrate; (4) irradiating the photoresist film with active rays through a mask; (5) crosslinking the irradiated photoresist film segments by heating; (6) developing the mask image in the photoresist film with a solvent to form an negative-tone relief image of the mask in the photoresist film; and (7) heat-treating the photoresist relief structure to further cure the photoresist and low surface energy polymer layers to form a permanent photoresist relief pattern on the low surface energy polymer substrate.

6. The method of claim 5, wherein said layer is applied to a substrate using the slot coating method.

7. The method of claim 5, wherein said layer is applied to a substrate using a piezoelectric ink jet printing device.

8. The method of claim 5, wherein said layer is applied to low surface energy substrates.

9. The method of claim 5, wherein the active rays comprise ultraviolet rays with wavelength ranging from about 200 to about 450 nanometers.

10. The permanent photoresist relief pattern made by the method of claim 5 for use in a display device.

11. The permanent photoresist relief pattern of claim 10, where said display device comprises smart phone displays, computer displays, and active signage.

12. The permanent photoresist relief pattern made by the method of claim 5 for use in a microfluidic device.

* * * * *